US012592468B2

(12) United States Patent
Herbsommer et al.

(10) Patent No.: US 12,592,468 B2
(45) Date of Patent: Mar. 31, 2026

(54) QUANTUM-BASED SENSOR HAVING A HOLLOW ELECTROMAGNETIC WAVEGUIDE WITH NON-METALLIC INTERIOR WALLS

(71) Applicant: TEXAS INSTRUMENTS INCORPORATED, Dallas, TX (US)

(72) Inventors: Juan Herbsommer, Allen, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/854,535

(22) Filed: Jun. 30, 2022

(65) Prior Publication Data

US 2024/0006734 A1 Jan. 4, 2024

(51) Int. Cl.
| | |
|---|---|
| *H01P 3/12* | (2006.01) |
| *G01R 15/00* | (2006.01) |
| *G04F 5/14* | (2006.01) |
| *H01P 11/00* | (2006.01) |

(52) U.S. Cl.
CPC .............. *H01P 3/122* (2013.01); *G01R 15/00* (2013.01); *G04F 5/14* (2013.01); *H01P 11/002* (2013.01)

(58) Field of Classification Search
CPC ... G04F 5/14; G04F 5/145; H03L 7/26; H01S 1/06; H01P 3/12; H01P 3/13; H01P 11/002
See application file for complete search history.

(56) References Cited

U.S. PATENT DOCUMENTS

| | | | | |
|---|---|---|---|---|
| 6,570,459 | B1* | 5/2003 | Nathanson | ................ G04F 5/14 |
| | | | | 331/94.1 |
| 10,605,840 | B1* | 3/2020 | Amarloo | ................ G04F 5/145 |
| 2002/0163394 | A1* | 11/2002 | Hollberg | ................ G04F 5/145 |
| | | | | 331/94.1 |
| 2006/0022761 | A1* | 2/2006 | Abeles | ................ G04F 5/14 |
| | | | | 331/94.1 |
| 2019/0152773 | A1* | 5/2019 | Herbsommer | ...... B81C 1/00047 |
| 2019/0173149 | A1* | 6/2019 | Elsherbini | ............ H01P 11/002 |
| 2019/0204786 | A1* | 7/2019 | Herbsommer | ............ G04F 5/14 |

\* cited by examiner

*Primary Examiner* — Ryan Johnson
(74) *Attorney, Agent, or Firm* — Zhenhai Fu; Frank D. Cimino

(57) ABSTRACT

A quantum-based sensor includes a hollow electromagnetic (EM) waveguide having non-metallic layers and external metallic layers. The hollow EM waveguide encloses a gas having a pressure that is less than a threshold pressure, and all interior surfaces of the hollow EM waveguide in contact with the gas are non-metallic.

22 Claims, 18 Drawing Sheets

300

(e.g., Cu, 2 µm THICK, 0.2 µm ROUGHNESS)

328

322

340

314          320          314

302

308

(e.g., Cu, 2 µm THICK, 0.2 µm ROUGHNESS)

| E FIELD [V/m] | |
|---|---|
| | 36852.6992 |
| | 9454.1748 |
| | 2425.3755 |
| | 622.2062 |
| | 159.6211 |
| | 40.9492 |
| | 10.5051 |
| | 2.6950 |
| | 0.6914 |
| | 0.1774 |
| | 0.0455 |
| | 0.0117 |
| | 0.0030 |
| | 0.0008 |
| | 0.0002 |
| | 0.0001 |

| E FIELD [V/m] | |
|---|---|
| | 36852.6992 |
| | 9454.1748 |
| | 2425.3755 |
| | 622.2062 |
| | 159.6211 |
| | 40.9492 |
| | 10.5051 |
| | 2.6950 |
| | 0.6914 |
| | 0.1774 |
| | 0.0455 |
| | 0.0117 |
| | 0.0030 |
| | 0.0008 |
| | 0.0002 |
| | 0.0001 |

| E FIELD [V/m] |
| --- |
| 38081.8164 |
| 11627.3486 |
| 3550.1228 |
| 1083.9432 |
| 330.9552 |
| 101.0490 |
| 30.8528 |
| 9.4201 |
| 2.8762 |
| 0.8782 |
| 0.2681 |
| 0.0819 |
| 0.0250 |
| 0.0076 |
| 0.0023 |
| 0.0007 |

| E FIELD [V/m] | |
|---|---|
| 38081.8164 | |
| 11627.3486 | |
| 3550.1228 | |
| 1083.9432 | |
| 330.9552 | |
| 101.0490 | |
| 30.8528 | |
| 9.4201 | |
| 2.8762 | |
| 0.8782 | |
| 0.2681 | |
| 0.0819 | |
| 0.0250 | |
| 0.0076 | |
| 0.0023 | |
| 0.0007 | |

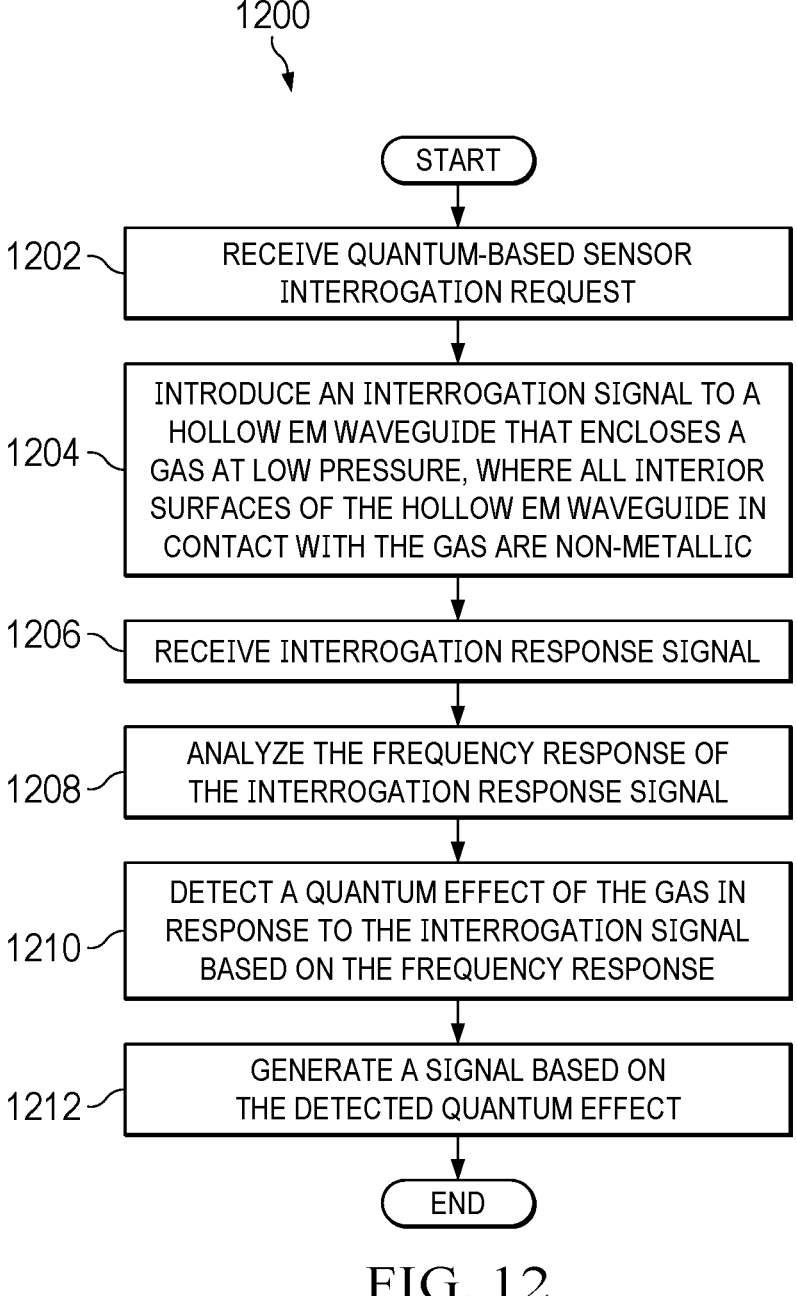

1200

START

1202 — RECEIVE QUANTUM-BASED SENSOR INTERROGATION REQUEST

1204 — INTRODUCE AN INTERROGATION SIGNAL TO A HOLLOW EM WAVEGUIDE THAT ENCLOSES A GAS AT LOW PRESSURE, WHERE ALL INTERIOR SURFACES OF THE HOLLOW EM WAVEGUIDE IN CONTACT WITH THE GAS ARE NON-METALLIC

1206 — RECEIVE INTERROGATION RESPONSE SIGNAL

1208 — ANALYZE THE FREQUENCY RESPONSE OF THE INTERROGATION RESPONSE SIGNAL

1210 — DETECT A QUANTUM EFFECT OF THE GAS IN RESPONSE TO THE INTERROGATION SIGNAL BASED ON THE FREQUENCY RESPONSE

1212 — GENERATE A SIGNAL BASED ON THE DETECTED QUANTUM EFFECT

END

FIG. 12

QUANTUM-BASED SENSOR HAVING A HOLLOW ELECTROMAGNETIC WAVEGUIDE WITH NON-METALLIC INTERIOR WALLS

BACKGROUND

Many electrical devices rely on sensing intended or unintended conditions or signals to perform their respective operations. Example sensors may be used to detect voltages, currents, and/or frequencies (e.g., related to electromagnetic signals in a circuit or communication channel), conductivity, temperature, pressure, resonant frequencies, presence or movement of ambient objects, and/or other parameters. A more recent sensor design is based on detecting the rota- tional quantum response of atoms or molecules in a physics cell resulting from an interrogation signal. In one example, the physics cell includes a hollow electromagnetic (EM) waveguide filled with a particular gas or molecule, and the interrogation signal is an EM wave that propagates along the hollow EM waveguide. Spectroscopy of the response signal resulting from application of the interrogation signal to the hollow EM waveguide may be used to detect presence of ambient EM fields and/or generate a precision clock signal. For more information regarding an example physics cell and uses, reference may be had to U.S. patent application Ser. No. 16/234,492, entitled, "Molecular Atomic Clock With Wave Propagating Rotational Spectroscopy Cell" and U.S. Pat. No. 9,529,334 ("the '334 Patent"), which are herein incorporated by reference in their entirety. The '334 Patent illustrates, among various other things, an atomic clock apparatus including a sealed cavity storing a dipolar gas. The sealed cavity includes: a first window through which an EM wave (or field) enters near a first end of the cavity; and a second window through which the EM wave exits near a second end of the cavity. The EM wave that exits the second window is measured to determine an amount of absorption by (or transmission through) the dipolar gas, where the measurement indicates the quantum response of the gas as a function of the EM wave frequency.

FIG. 1 is a cross-sectional view showing a physics cell 100 in accordance with a conventional approach. In the example of FIG. 1, the physics cell 100 is formed by a glass layer 102, a first silicon wafer layer 106, and a second silicon wafer layer 114. Specifically, the glass layer 102 is bonded to the first silicon wafer layer 106 via an anodic bond 104, and the second silicon wafer layer 114 is bonded to the first silicon wafer layer 106 via a eutectic bond 110 (e.g., an In—Au eutectic bond). After the glass layer 102, the first silicon wafer layer 106, and the second silicon wafer layer 114 are bonded, a sealed cavity 116 is formed. Before such bonding is complete, internal Au 118 is added to at least some of the walls forming the cavity 116 to improve conductivity along the hollow EM waveguide formed by the physics cell 100. The internal Au 118 as well as metal contacts 120 on an underside of the glass layer 102 may be etched or otherwise shaped to include a first interrogation window 122 and a second interrogation window 124 for the physics cell 100.

The hollow EM waveguide of the physics cell 100 enables an EM wave to propagate and interact with the gas in the cavity 116. FIG. 2 is a top view showing a layout 200 of the physics cell 100 of FIG. 1 in accordance with a conventional approach. As shown in the layout 200 of FIG. 2, the cavity 116 of the physics cell 100 has a U shape, where the first interrogation window 122 is spaced from the second inter- rogation window 124 (i.e., positioned on opposite sides of the U shape). As described above, the internal Au 118 covers internal surfaces of the physics cell 100 in contact with the gas in the cavity 116. The internal Au 118 provides func- tionality including: 1) sufficient conductivity for the hollow EM waveguide to have very low ohmic loss (no more than few decibels) and avoid weakening the interrogation signal such that a target signal-to-noise (SNR) for quantum-based sensing operations is achieved; 2) limiting or avoiding chemical reactions with the gas in the cavity 116; and 3) enabling low temperature eutectic bonding (e.g., the eutectic bond 110 of FIG. 1) options for physics cell construction. However, the internal Au 118 has a high-cost.

SUMMARY

In accordance with an example embodiment, a quantum-based sensor comprises a hollow electromagnetic (EM) waveguide having: a first metallic layer having a first surface and a second surface opposite the first surface; and a first non-metallic layer adjacent the first metallic layer, the first non-metallic layer having a first surface and a second surface opposite the first surface, the first surface of the first non-metallic layer facing the second surface of the first metallic layer. The hollow EM waveguide also has a second non-metallic layer adjacent the second surface of the first non-metallic layer, the second non-metallic layer having a first surface, a second surface opposite the first surface, a third surface and a fourth surface, the first surface of the second non-metallic layer facing the second surface of the first non-metallic layer, the third surface of the second non-metallic layer forming a first side wall of the hollow EM waveguide, and the fourth surface of the second non-metallic layer forming a second side wall of the hollow EM waveguide opposite the first side wall. The hollow EM waveguide also has: a third non-metallic layer adjacent the second surface of the second non-metallic layer, the third non-metallic layer having a first surface and a second surface opposite the first surface, the first surface of the third non-metallic layer facing the second surface of the second non-metallic layer; and a second metallic layer adjacent the third non-metallic layer and having a first surface and a second surface opposite the first surface, the second surface of the third non-metallic layer facing the first surface of the second metallic layer. The hollow EM waveguide encloses a gas having a pressure that is less than a threshold pressure and all interior surfaces of the hollow EM waveguide in contact with the gas are non-metallic.

In another example embodiment, a circuit comprises: a hollow EM waveguide configured to enclose a gas having a pressure that is less than a threshold pressure, wherein all interior surfaces of the hollow EM waveguide in contact with the gas are non-metallic; and a control circuit having an antenna interface aligned with the hollow EM waveguide. The control circuit is configured to: apply an interrogation signal to the hollow EM waveguide via the antenna inter- face; receive an interrogation response signal from the hollow EM waveguide via the antenna interface; analyze a frequency response of the interrogation response signal; detect a quantum effect of the gas in response to the interrogation signal based on the frequency response; and generate a signal based on the detected quantum effect.

In yet another example embodiment, a method of manu- facturing a quantum-based sensor comprises: adding a first set of layers of a physics cell to form part of a hollow EM waveguide; adding a second set of layers of the physics cell to enclose a gas having a pressure that is less than a threshold pressure and complete the hollow EM waveguide, wherein all interior surfaces of the hollow EM waveguide in contact with the gas are non-metallic; and aligning an interrogation interface of the hollow EM waveguide with an antenna interface of a control circuit separate from the physics cell.

BRIEF DESCRIPTION OF THE DRAWINGS

FIG. 12 is a flowchart showing a quantum-based sensor method in accordance with an example embodiment.

DETAILED DESCRIPTION

Figure 1:
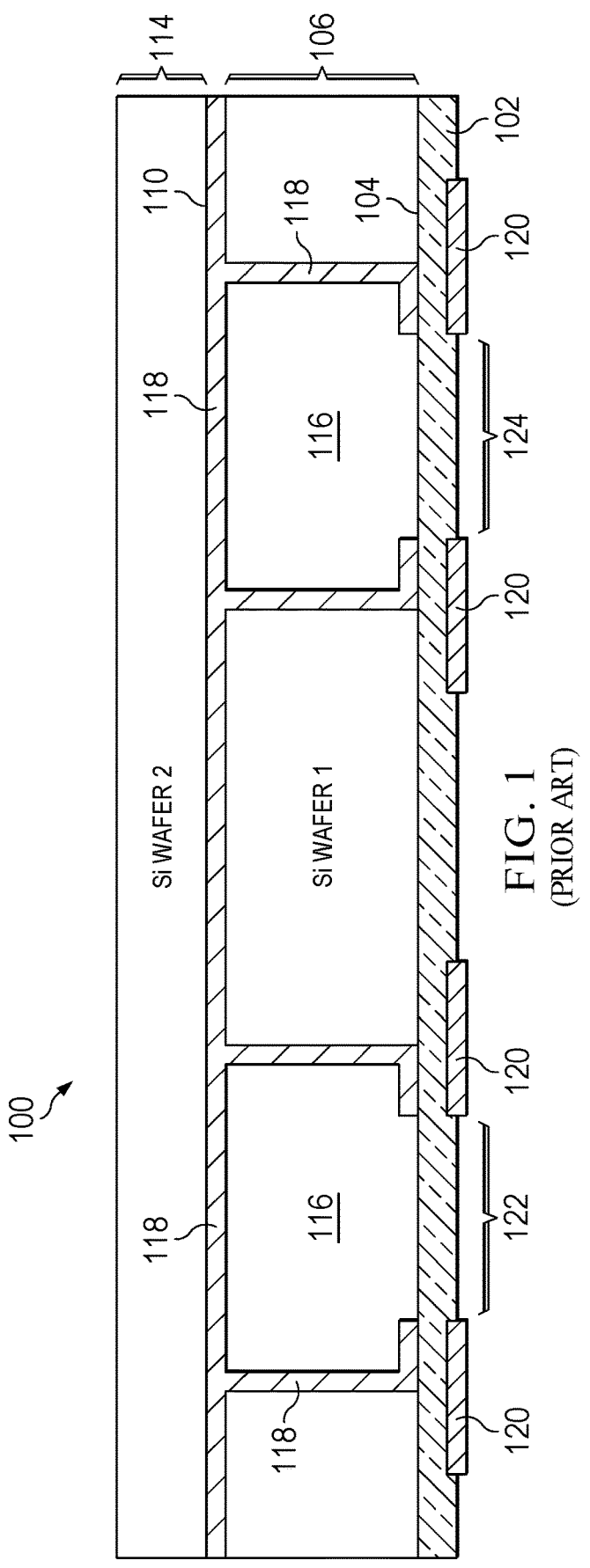
FIG. 1 is a cross-sectional view showing a physics cell in accordance with a conventional approach.
Figure 2:
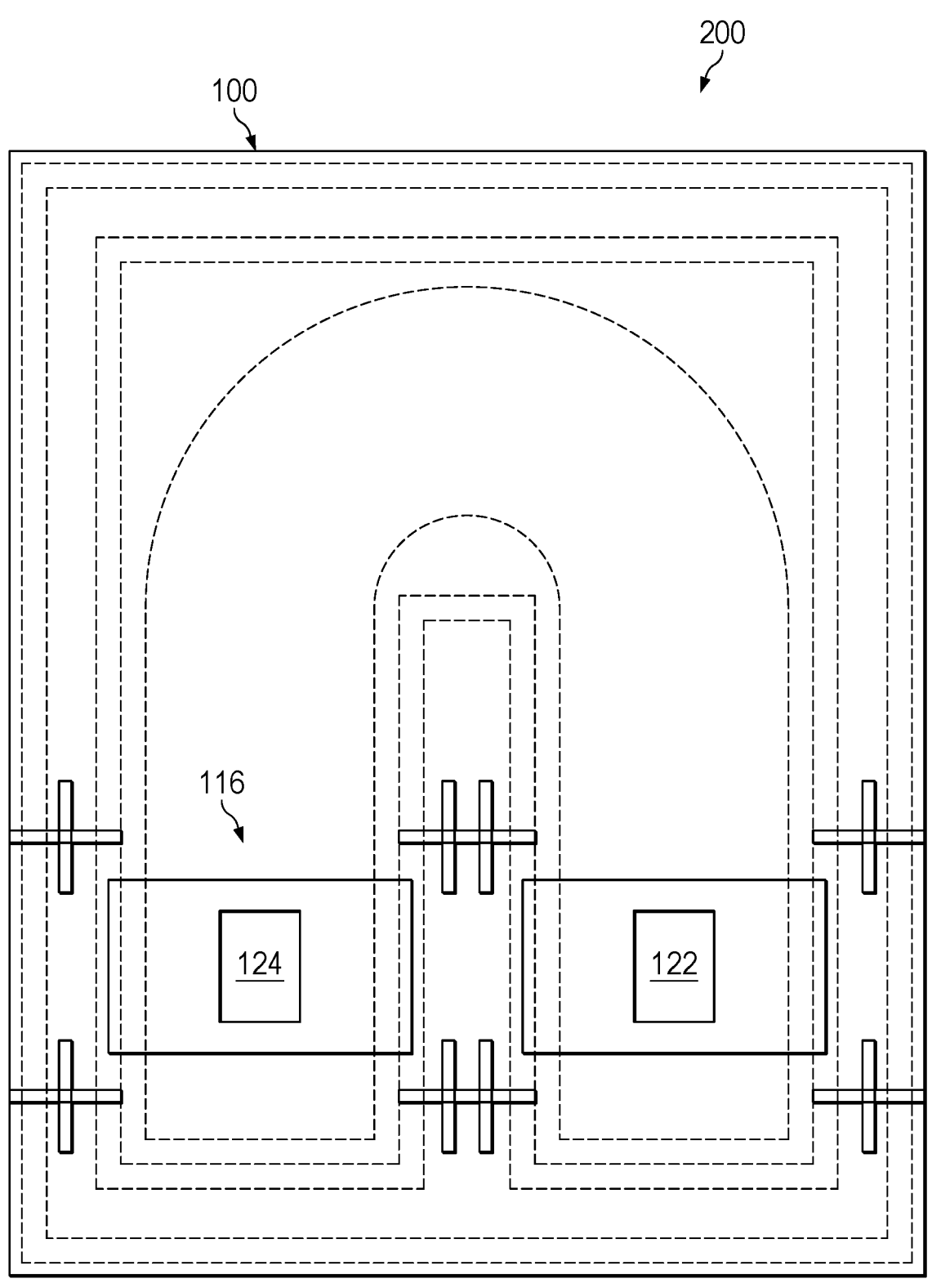
FIG. 2 is a top view showing a layout of the physics cell of FIG. 1 in accordance with a conventional approach.

The same reference number is used in the drawings for the same or similar (either by function and/or structure) features. Described herein are quantum-based sensor options and related circuits, where the quantum-based sensor options provide a physics cell design having a hollow electromagnetic (EM) waveguide with non-metallic interior walls. By using a physics cell design having a hollow EM waveguide with non-metallic interior walls, the cost of each quantum-based sensor is reduced relative to quantum-based sensors that use a physics cell having a hollow EM waveguide with metallic interior walls (e.g., the physics cell 100 of FIGS. 1 and 2). The ohmic losses of a quantum-based sensor having a physics cell with non-metallic interior walls may be somewhat increased and signal-to-noise ratio (SNR) may be reduced (e.g., by a few decibels) relative to a physics cell having metallic interior walls, but will still comply with target design specifications. In some example embodiments, a physics cell design includes features (e.g., using highly doped silicon wafers or strategically doping the internal layers or surfaces of the physics cell, external metallization along the hollow EM waveguide, electronic band gap (EBG) structures around the hollow EM waveguide, and/or other conductivity or EM field management options for the physics cell) to compensate for the hollow EM waveguide having non-metallic interior surfaces rather than metallic interior surfaces.

Figure 3A:
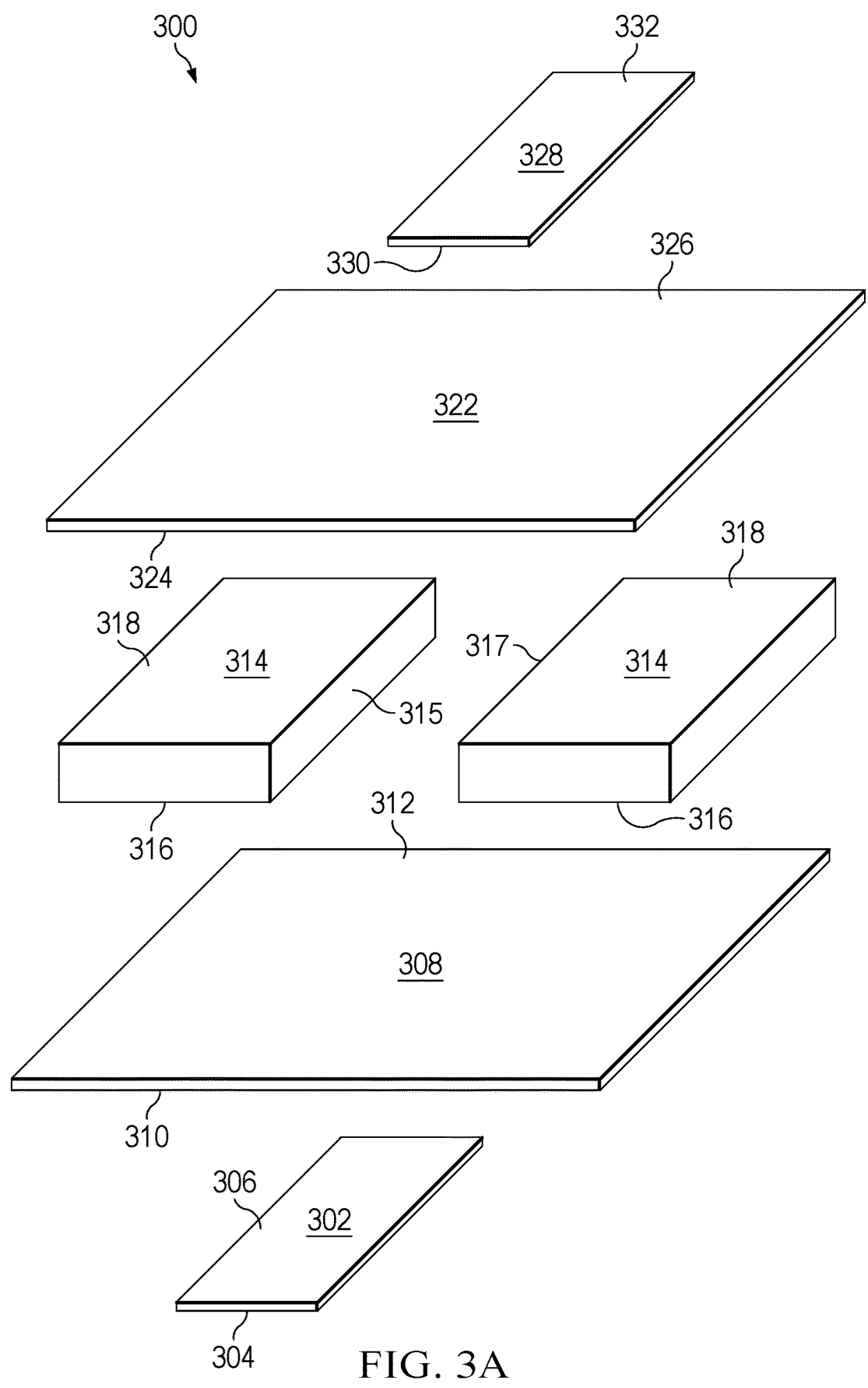
FIG. 3A is an exploded view showing layers of a physics cell in accordance with an example embodiment.

FIG. 3A is an exploded view showing layers of a physics cell 300 in accordance with an example embodiment. The layers of the physics cell 300 include: a first metallic layer 302 having a first surface 304 and a second surface 306 opposite the first surface 304; and a first non-metallic layer 308 adjacent the first metallic layer 302, the first non-metallic layer 308 having a first surface 310 and a second surface 312 opposite the first surface 310. The first surface 310 of the first non-metallic layer 308 faces the second surface 306 of the first metallic layer 302. The layers of the physics cell 300 also include: a second non-metallic layer 314 adjacent the second surface 312 of the first non-metallic layer 308. The second non-metallic layer 314 has a first surface 316, a second surface 318 opposite the first surface 316, a third surface 315 and a fourth surface 317. The first surface 316 of the second non-metallic layer 314 faces the second surface 312 of the first non-metallic layer 308. The third surface 315 of the second non-metallic layer 314 forms a first side wall of a hollow EM waveguide. The fourth surface 317 of the second non-metallic layer 314 forms a second side wall of the hollow EM waveguide opposite the first side wall. The layers of the physics cell 300 also include a third non-metallic layer 322 adjacent the second surface 318 of the second non-metallic layer 314. The third non-metallic layer 322 has a first surface 324 and a second surface 326 opposite the first surface 324. The first surface 324 of the third non-metallic layer 322 faces the second surface 318 of the second non-metallic layer 314. The layers of the physics cell 300 also include a second metallic layer 328 adjacent the third non-metallic layer 322 and having a first surface 330 and a second surface 332 opposite the first surface 330. The second surface 326 of the third non-metallic layer 322 faces the first surface 330 of the second metallic layer 328.

Figure 3B:
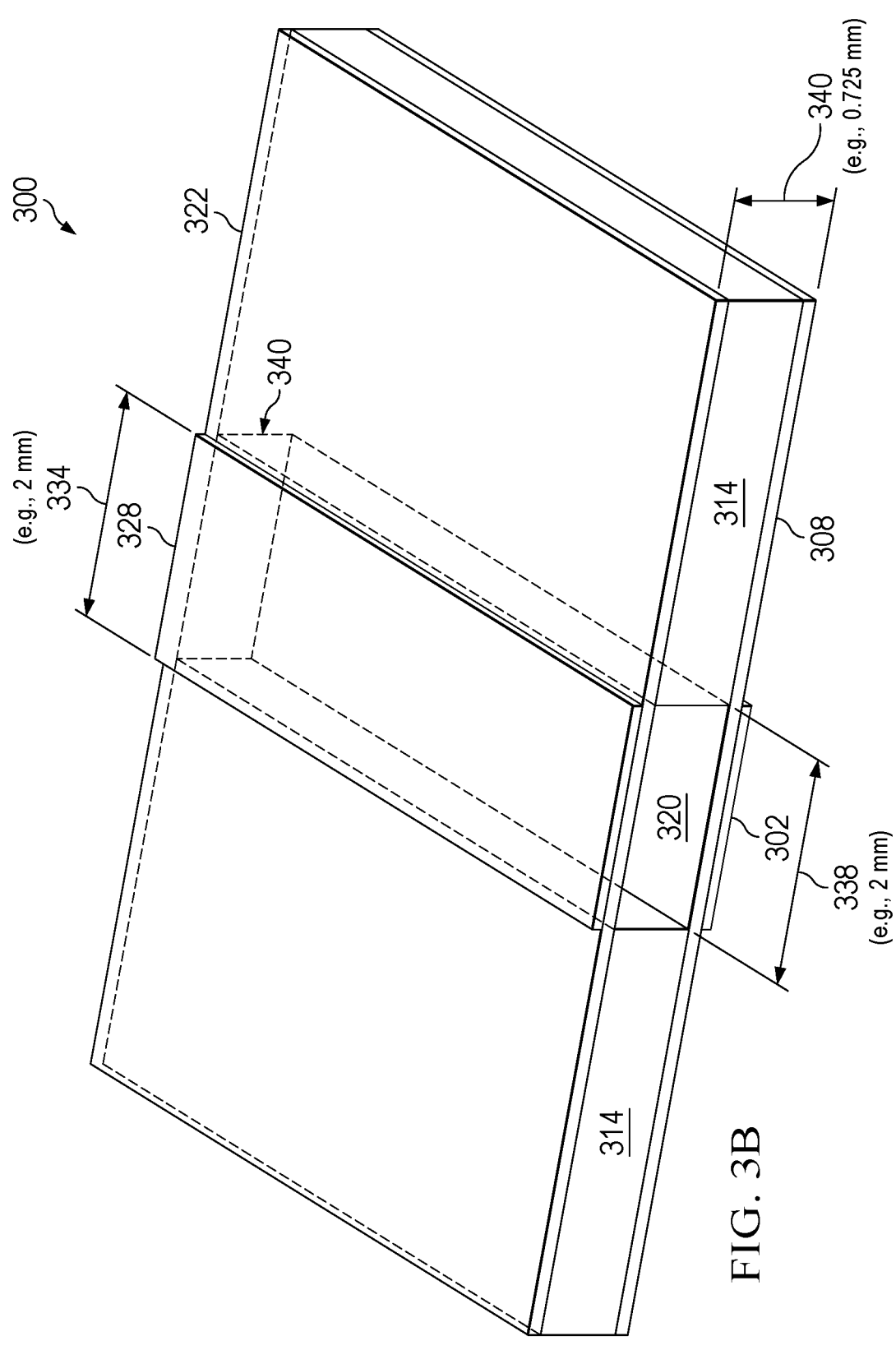
FIGS. 3B and 3C are perspective views showing assembled layers of the physics cell related to FIG. 3A.
Figure 3C:
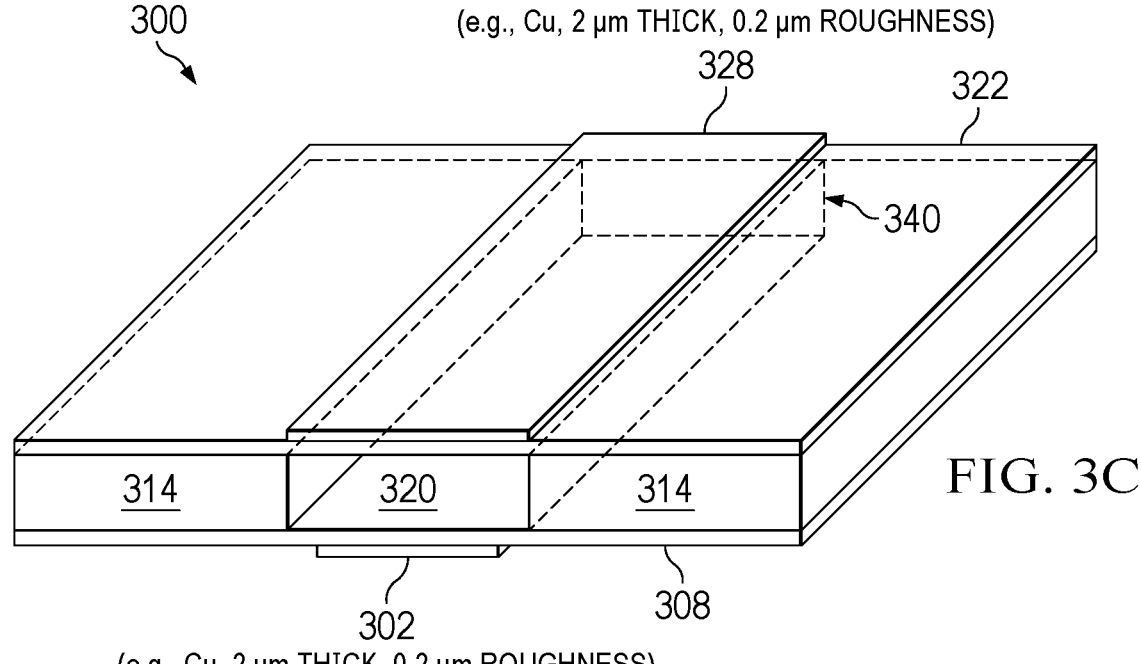

When the layers of the physics cell 300 are bonded together, a hollow EM waveguide is formed. In FIGS. 3A-3C, only a portion of the physics cell 300 and related hollow EM waveguide is represented. In different example embodiments, the dimensions of the physics cell 300 and the propagation path provided by the hollow EM waveguide may vary. In some example embodiments, the dimensions of the hollow rectangular waveguide (e.g., the cross-sectional area) are designed to provide a mono-mode EM propagation (e.g., $TE_{10}$ mode). In order to achieve EM mono-mode propagation the cutoff frequency of the $TE_{10}$ mode has to be lower than the quantum transition that will be used to operate the quantum-based sensor. The cross-sectional dimensions of the hollow rectangular waveguide are also designed such that the cutoff frequencies of the next higher modes are higher than the operating frequency, ensuring the exclusive propagation of mode $TE_{10}$. Example propagation paths for the hollow EM waveguide may include: a U shape (see e.g., FIG. 2); a W shape; an S shape; a spiral shape, and/or other shapes. Regardless of the particular dimensions of the physics cell 300 and related propagation path provided by the hollow EM waveguide, the hollow EM waveguide encloses a gas having a pressure that is less than a threshold pressure (e.g., below atmospheric pressure). Also, all interior surfaces of the hollow EM waveguide in contact with the gas (e.g., part of the second surface 312 of the first non-metallic layer 308, the third surface 315 of the second non-metallic layer 314, the fourth surface 317 of the second non-metallic layer 314, and part of the first surface 324 of the third non-metallic layer 322) are non-metallic.

FIGS. 3B and 3C are perspective views showing assembled layers of the physics cell 300 related to FIG. 3A. The assembled layers in FIGS. 3B and 3C include the first metallic layer 302, the first non-metallic layer 308, the second non-metallic layer 314, the third non-metallic layer 322, and the second metallic layer 328 of FIG. 3A. When assembled (e.g., bonded together), the first non-metallic layer 308, the second non-metallic layer 314, and the third non-metallic layer 322 form a cavity 320 and interior surfaces of a hollow EM waveguide 340 of the physics cell 300. The first metallic layer 302 and the second metallic layer 328 are exterior layers (i.e., exterior to the non-metallic layers of the physics cell 300) that follow the propagation path of the hollow EM waveguide 340. With the first metallic layer 302, the second metallic layer 328, and/or other conductivity enhancements for the hollow EM waveguide 340, the ohmic losses in the EM propagation along the hollow EM waveguide 340 are reduced and the overall SNR of the quantum-based sensor is sufficient without interior metallization.

In FIGS. 3B and 3C, some example dimensions are given. Without limitation, the example dimensions include: 2 mm for the width 334 of the first metallic layer 302 and the second metallic layer 328; 2 mm for the width 338 of the cavity 320; 0.725 mm for the height 340 of the second non-metallic layer 314; 2 um thickness for the first metallic layer 302 and the second metallic layer 328; and 0.2 um roughness for the first metallic layer 302 and the second metallic layer 328. In different example embodiments, these dimensions may vary. As previously noted, the physics cell 300 shown in FIGS. 3A-3C is a partial view. In different example embodiments, a more complete view of the physics cell 300 would show the hollow EM waveguide 340 provides a more extensive propagation path having a shape such as: a U shape (see e.g., FIG. 2); a W shape; an S shape; a spiral shape, and/or other shapes.

Without limitation, the first metallic layer 302 and the second metallic layer 328 may be made from copper, aluminum, or related alloys. The first non-metallic layer 308 and the third non-metallic layer 322 may be made from glass. The second non-metallic layer 314 may be a semiconductor (e.g., silicon). In different example embodiments, the second non-metallic layer 314 is the exposed etched side of a uniformly doped semiconductor wafer having a target resistivity below a threshold. In some example embodiments, the second non-metallic layer 314 is a uniformly doped semiconductor having a target resistivity below a threshold. In other example embodiments, the second non-metallic layer 314 is a semiconductor with doped surfaces (e.g., at least the third surface 315 and the fourth surface 317) having a target resistivity below a threshold.

Figure 4:
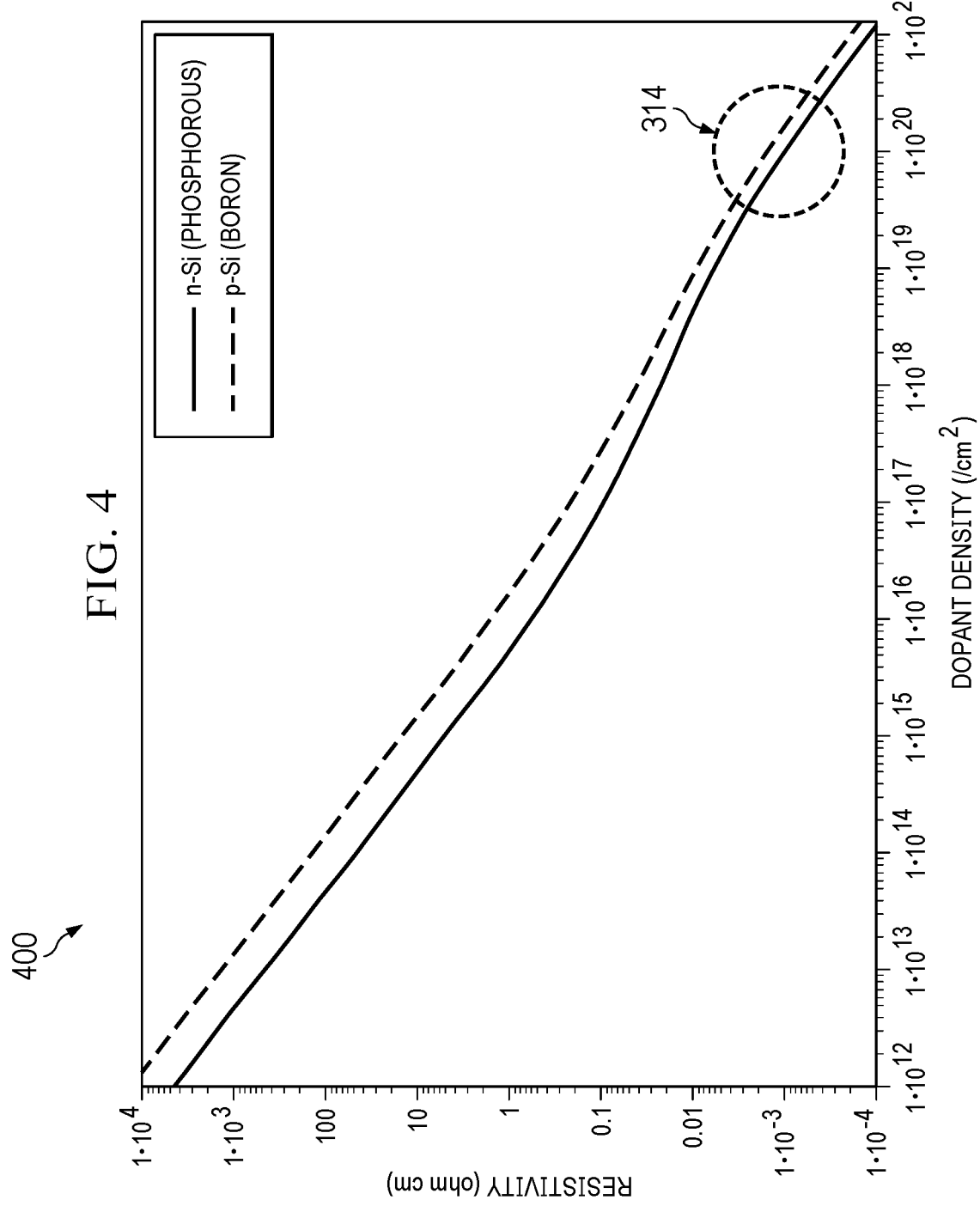
FIG. 4 is a graph showing semiconductor resistivity as a function of dopant density.

FIG. 4 is a graph 400 showing semiconductor resistivity as a function of dopant density. In graph 400, semiconductor resistivity decreases as dopant density increases. In some example embodiments, the dopant density for the second non-metallic layer 314 or particular surfaces of the second non-metallic layer 314 (e.g., the third surface 315 and the fourth surface 317 of the second non-metallic layer 314) is selected to reduce resistivity of at least some of the interior side walls of the hollow EM waveguide to below a target resistivity.

Figure 5:
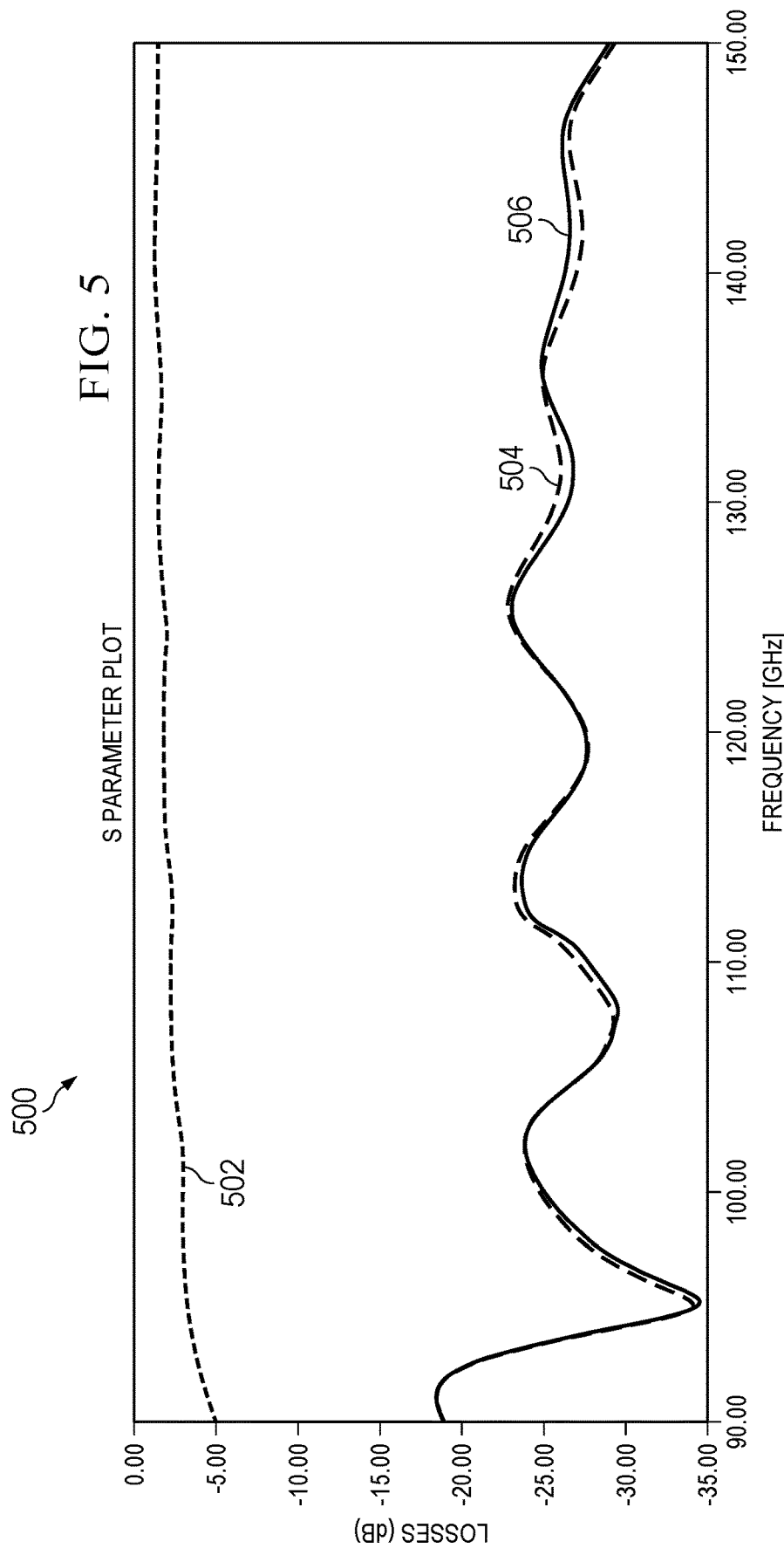
FIG. 5 is a graph showing S parameter plots as a function of frequency in accordance with the physics cell of FIGS. 3A-3C.

FIG. 5 is a graph 500 showing S-parameter plots as a function of frequency in accordance with the physics cell 300 of FIGS. 3A-3C. In graph 500, plot 502 is the insertion loss S12 of a portion of the hollow EM waveguide 340 in decibels (dB), plot 504 is the return loss S11 as seen at a first end (end 1 for the S-parameter) of the hollow EM waveguide 340 in dB, and plot 506 is the return loss S22 as seen at a second end (end 2 for the S-parameter) of the hollow EM waveguide in dB. In some example embodiments, S-parameter plots such as the those in graph 500 may indicate whether the losses in the hollow EM waveguide 340 are acceptable (i.e., whether the signal will be weakened too much and/or whether the SNR performance of the physics cell 300 is below a target specification).

Figure 6A:
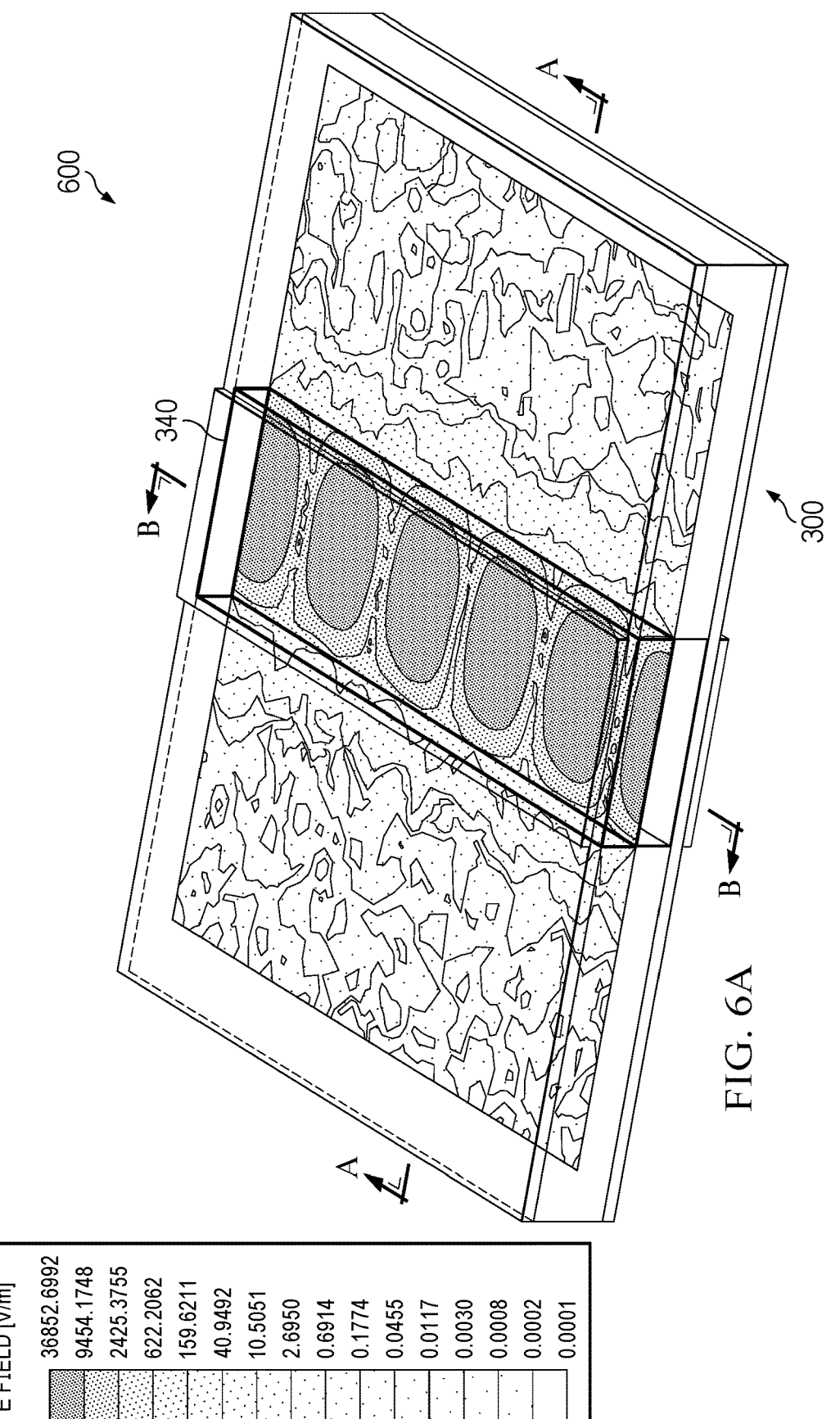
FIGS. 6A-6C are views showing electric fields during sense operations related to the portion of the physics cell of FIGS. 3A-3C.
Figure 6B:
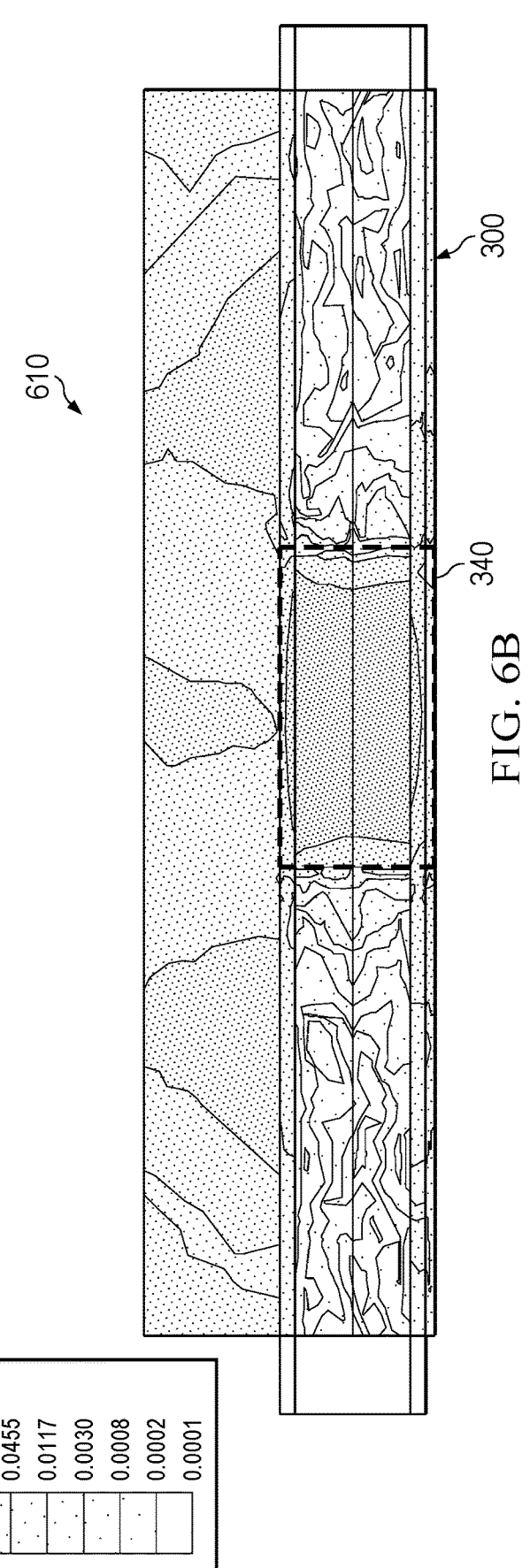
Figure 6C:
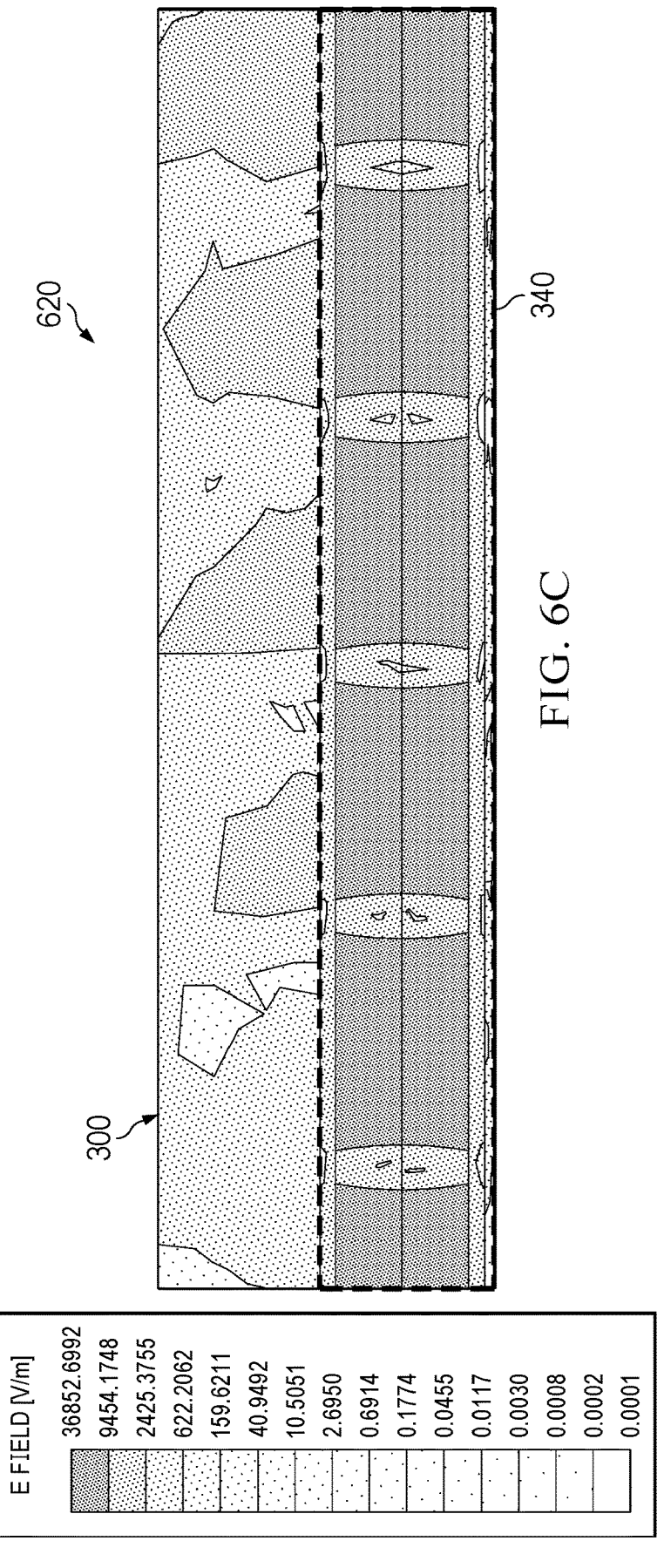

FIGS. 6A-6C are views 600, 610, and 620 showing electric fields during sense operations related to the physics cell 300 of FIGS. 3A-3C. In the perspective view 600, an EM wave propagates in a transverse electric mode ($TE_{10}$) along the hollow EM waveguide 340 of the physics cell 300. As shown, the EM field strength varies as a function of position, and is concentrated into bands along the hollow EM waveguide 340 of the physics cell 300. In view 600, cross-sections A and B of the physics cell 300 are shown. Cross-section B corresponds to a plane that extends along a longitudinal axis of the hollow EM waveguide 340. Meanwhile, cross-section A corresponds to a transverse plane relative to the longitudinal axis of the hollow EM waveguide 340.

In views 610 and 620 of FIG. 6B, cross-sections A and B of the physics cell 300 are represented during sense operations. As shown in views 610 and 620, the EM field strength around the physics cell 300 (external to the hollow EM waveguide 340) varies and is sometimes quite high, indicating that the physics cell 300 is losing part of the signal as it is radiated to the exterior of the cavity. This radiation is concentrated in the corners of the cavity (as depicted in 6B) where the EM wave escapes through the glass in the space that it is not confined by the vertical silicon walls and the reflective metal deposited on the external face of the glass. Such radiation losses are detrimental to the operation of the quantum sensor because it weakens the signal reaching the detector and thus decreasing the SNR of quantum-based sensing operations related to the physics cell 300. Depending on the sense application, such losses may be unacceptable.

In order to eliminate such radiation leaks, high-impedance structures (HIS), metamaterial structures, and/or EBG structures may be added to a physics cell. These structures are patterned in the metallic surface of interest and, if designed properly, they will create a high surface impedance that prevents the propagation of EM waves. In some example embodiments, such high impedance surfaces may be introduced in the areas where radiation is leaking from the hollow EM waveguide.

Figure 7:
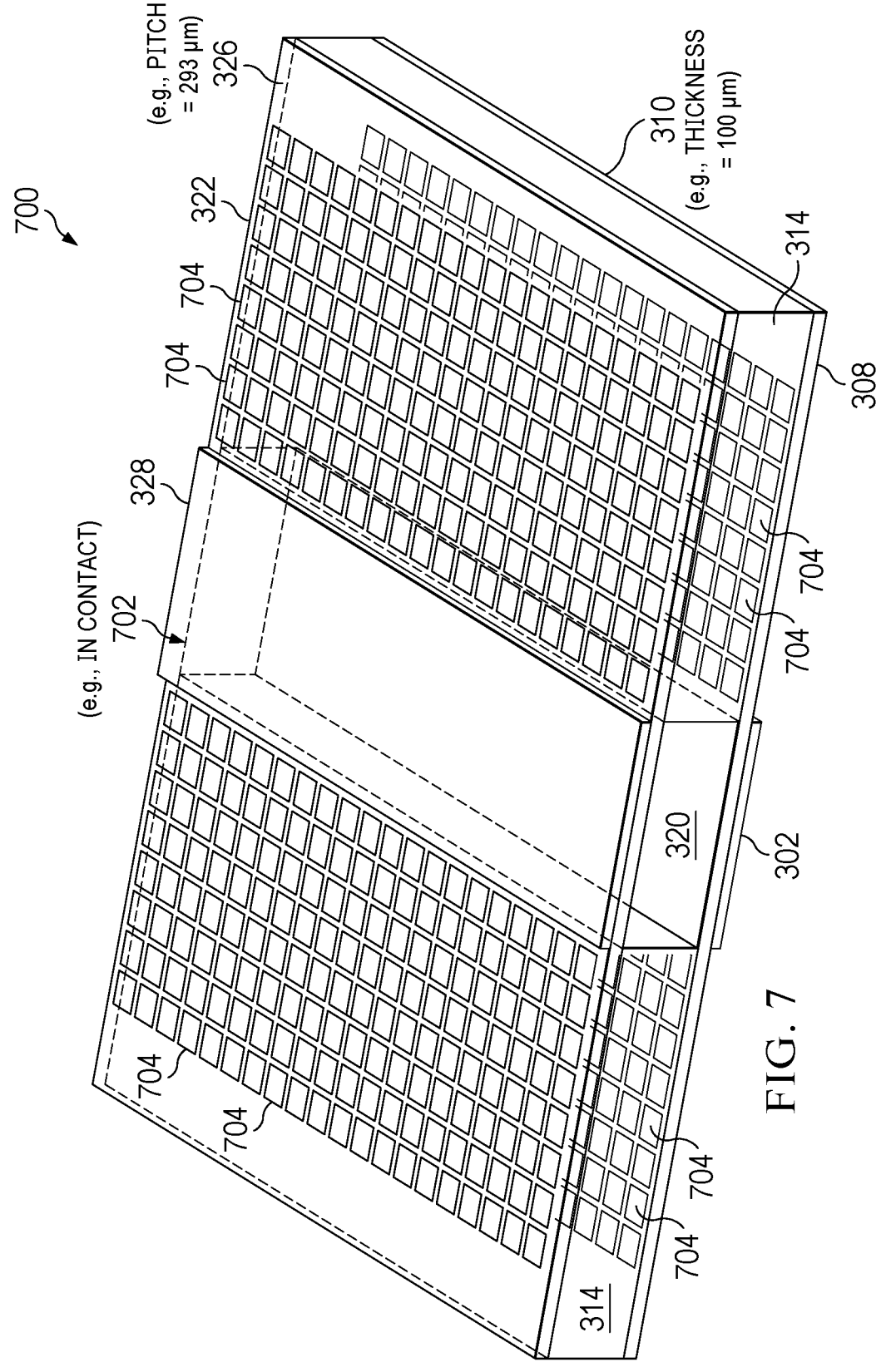
FIG. 7 is a perspective view showing layers of a physics cell with electronic band gap (EBG) structures in accordance with an example embodiment.

FIG. 7 is a perspective view showing a portion of a physics cell 700 having EBG structures 704 in accordance with an example embodiment. In the example of FIG. 7, the physics cell 700 has the same layers as the physics cell 300. In addition, the physics cell 700 includes EBG structures 704 on: the first surface 310 of the first non-metallic layer 308; and the second surface 326 of the third non-metallic layer 322. Also, a hollow EM waveguide 702 for the physics cell 700 is represented in FIG. 7. The shape of the pattern of EBG structures 704 as well as distance between patterns determines a "mosaic" that creates a high impedance surface only in a band of frequencies. Outside that band of operation, the EBG structures 704 lose their high impedance characteristics. As a consequence, the EBG structures 704 have to be properly designed to allow the frequency band of operation of the sensor to be inside the band of operation of the EBG structures 704.

In the example of FIG. 7, the EBG structures 704 nearest the first metallic layer 302 and the second metallic layer 328 may electrically contact the first metallic layer 302 and the second metallic layer 328. Remaining EBG structures 704 are distributed (over the first surface 310 of the first non-metallic layer 308 and/or the second surface 326 of the third non-metallic layer 322) and spaced from each other based on a predetermined pitch (e.g., 293 um). In different example embodiments, the thickness of the first non-metallic layer 308 and the third non-metallic layer 322 vary. In one example embodiment, a thickness of the first non-metallic layer 308 and the third non-metallic layer 322 is approximately 100 um. In other example embodiments, the thickness of the first non-metallic layer 308 and the third non-metallic layer 322 is increased or reduced (e.g., by half).

In different example embodiments, the thickness, shape, distribution and/or spacing of the EBG structures 704 vary. In some example embodiments, the spacing of the EBG structures 704 vary depending on the thickness of the first non-metallic layer 308 and the third non-metallic layer 322. As another option, the EBG structures 704 may cover some or all of the external surfaces of a physics cell. Without limitation, the EBG structures 704 may include high-resistivity shapes that extend from a position of the hollow EM waveguide 702 of the physics cell 700 to ambient portions of the first surface 310 of the first non-metallic layer 308 for at least two wavelengths of energy related to a target interrogation signal for the hollow EM waveguide. The EBG structures 704 also may include high-resistivity shapes that extend from a position of the hollow EM waveguide of the physics cell 700 to ambient portions of the second surface 326 of the third non-metallic layer 322 for at least two or three wavelengths of energy related to a target interrogation signal for the hollow EM waveguide 702.

Figure 8:
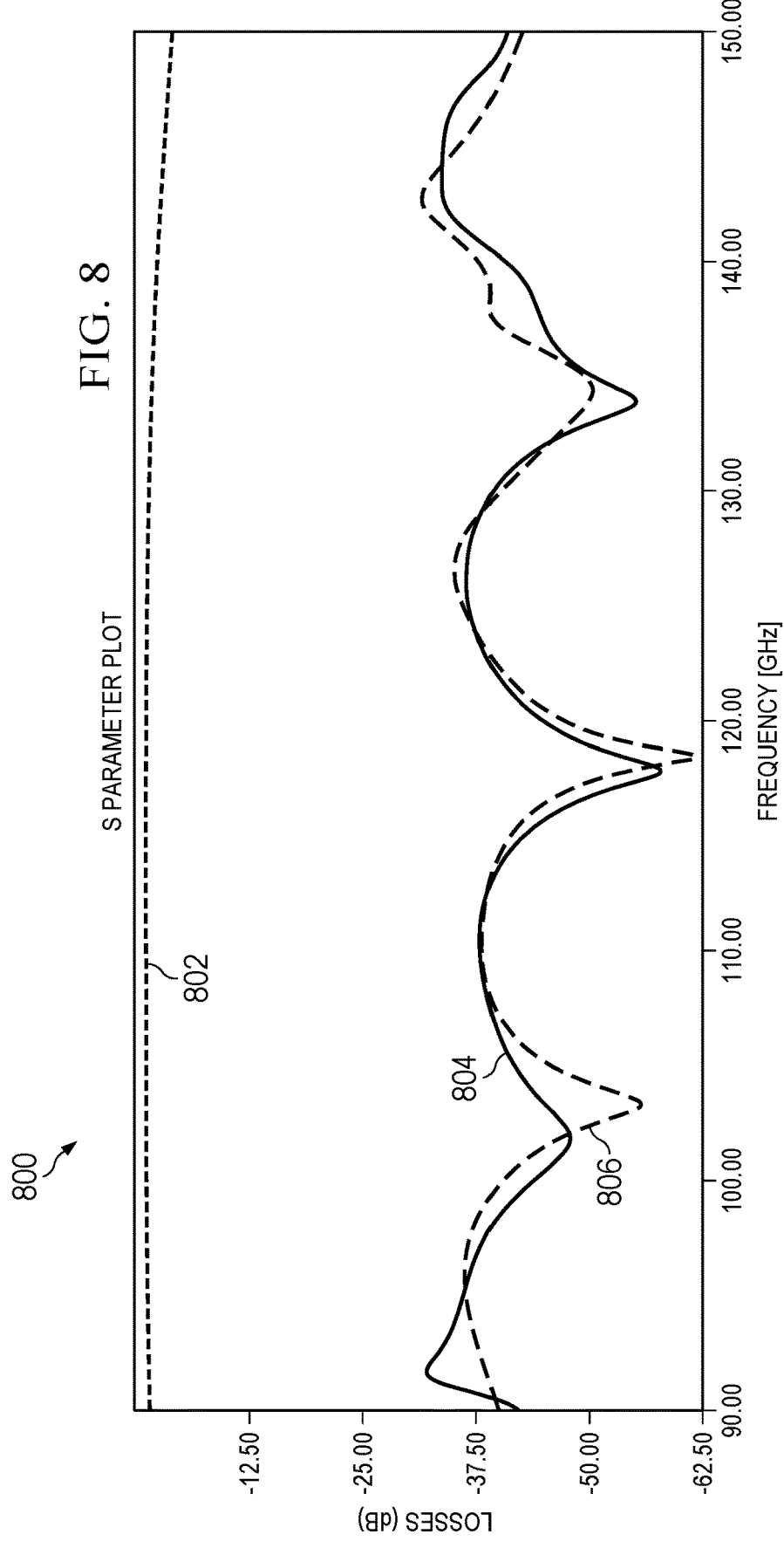
FIG. 8 is a graph showing S parameter plots as a function of frequency in accordance with the physics cell of FIG. 7.

FIG. 8 is a graph 800 showing S parameter plots as a function of frequency in accordance with the physics cell 700 of FIG. 7. In graph 800, plot 802 is the insertion loss S12 of a portion of the length of the hollow EM waveguide 702 in dB, plot 804 is the return loss S11 of the same portion of hollow EM waveguide 702 as seen from a first end (end 1) of the waveguide section, and plot 806 is the return loss S22 from the same portion as seen from the other end of the hollow EM waveguide 702. As indicated by plots 802, 804, and 806, the low insertion loss (negative but closes to zero) indicates a good (not lossy) propagation of the EM wave. The highly negative return losses (much lower than −10 dB) indicate that a very small portion of the EM wave is reflected back so the signal will arrive strong at the receiving antenna and the SNR performance of the physics cell 700 may achieve a target SNR performance. The S-parameters of plots 802, 804 and 806 are improved relative to S-parameters of plots 502, 504, and 506, demonstrating the effectiveness of the EBG structures in reducing waveguide losses.

Figure 9A:
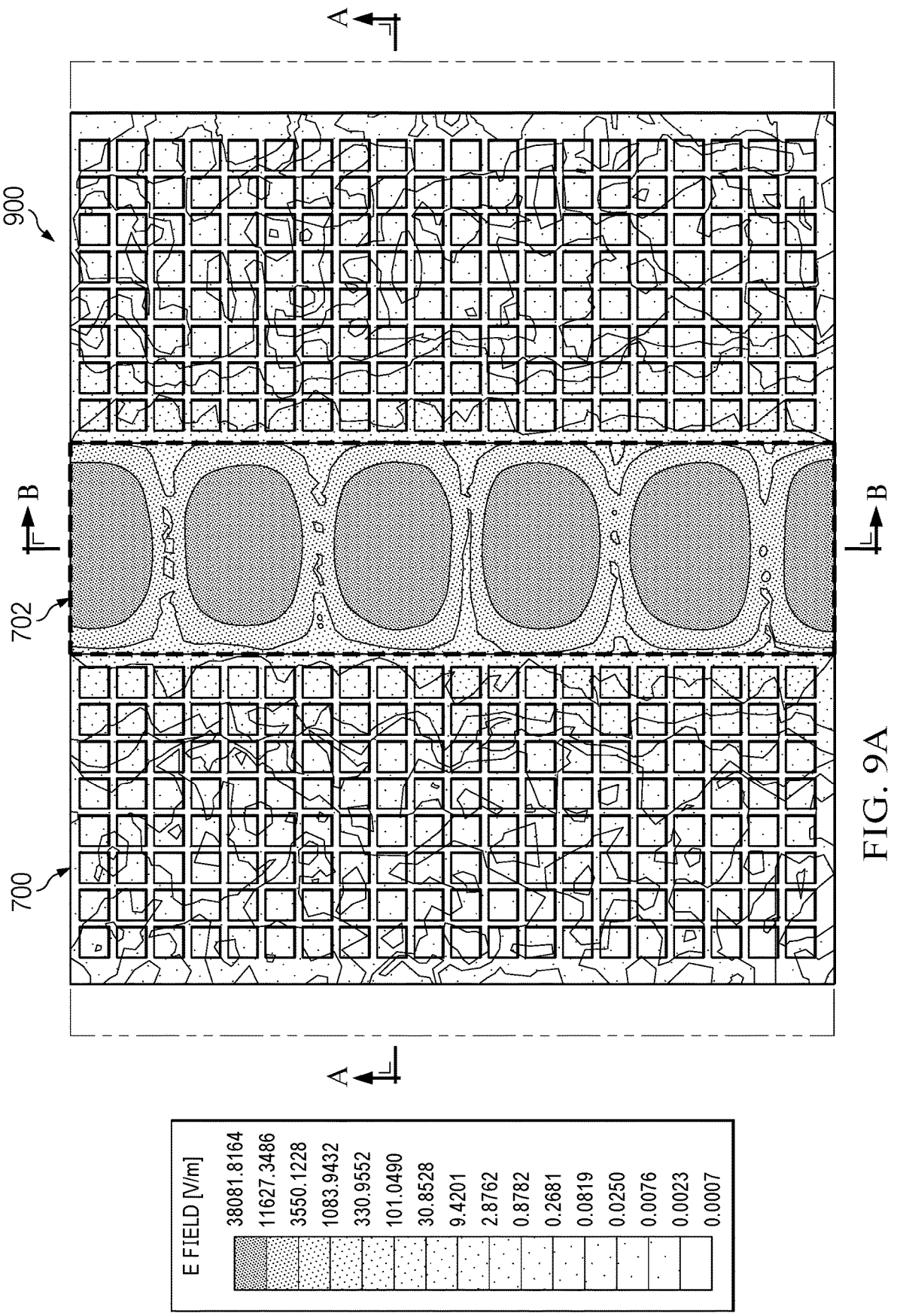
FIGS. 9A-9C are views showing electric fields during sense operations related to the physics cell of FIG. 7.
Figure 9B:
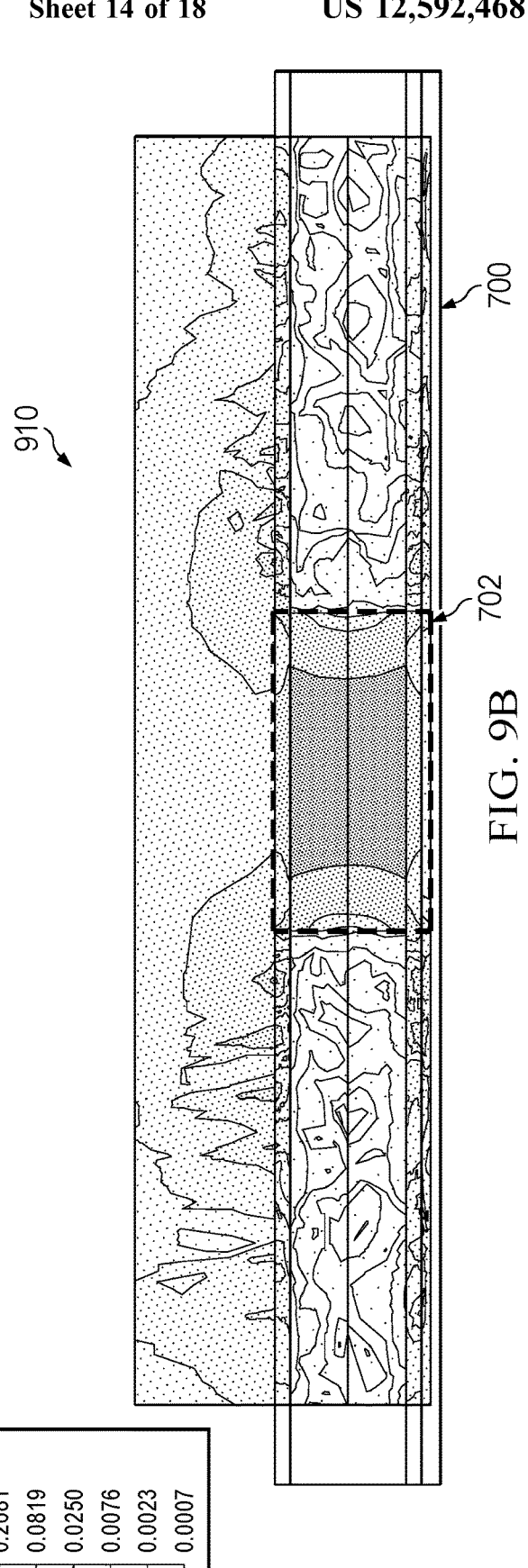
Figure 9C:
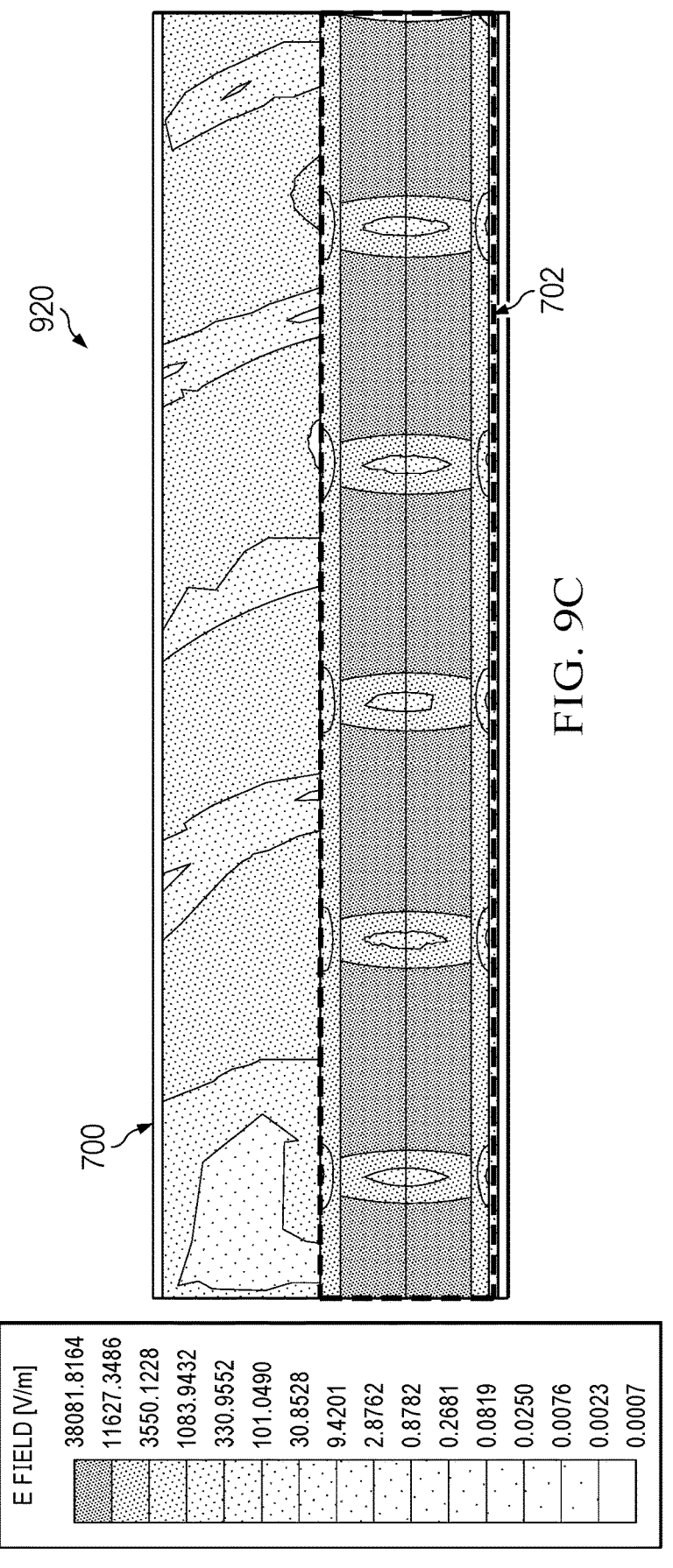

FIGS. 9A-9C are views 900, 910, and 920 showing electric fields during sense operations related to the portion of the physics cell 700 of FIG. 7. In the perspective view 900, an EM wave propagates in a transverse electric mode ($TE_{10}$) along the hollow EM waveguide 702 of the physics cell 700. As shown, the EM field strength varies as a function of position, and is concentrated into bands along the hollow EM waveguide 702 of the physics cell 700. In view 900, cross-sections A and B of the physics cell 700 are shown. Cross-section B corresponds to a plane that extends along a longitudinal axis of the hollow EM waveguide 702. Meanwhile, cross-section A corresponds to a transverse plane relative to the longitudinal axis of the hollow EM waveguide 702.

In views 910 and 920 of FIG. 6B, cross-sections A and B of the physics cell 700 are represented during sense operations. As shown in views 910 and 920, the EM field strength around the physics cell 700 varies and is more concentrated in the hollow EM waveguide 702, indicating the physics cell 700 is somewhat less lossy during sense operations relative to the physics cell 300. The reduction of losses for the hollow EM waveguide 702 (e.g., due to the EBG structures 704 and/or other EM field management options) increase the SNR of the quantum-based sensing operations related to the physics cell 700 relative to the physics cell 300.

Figure 10:
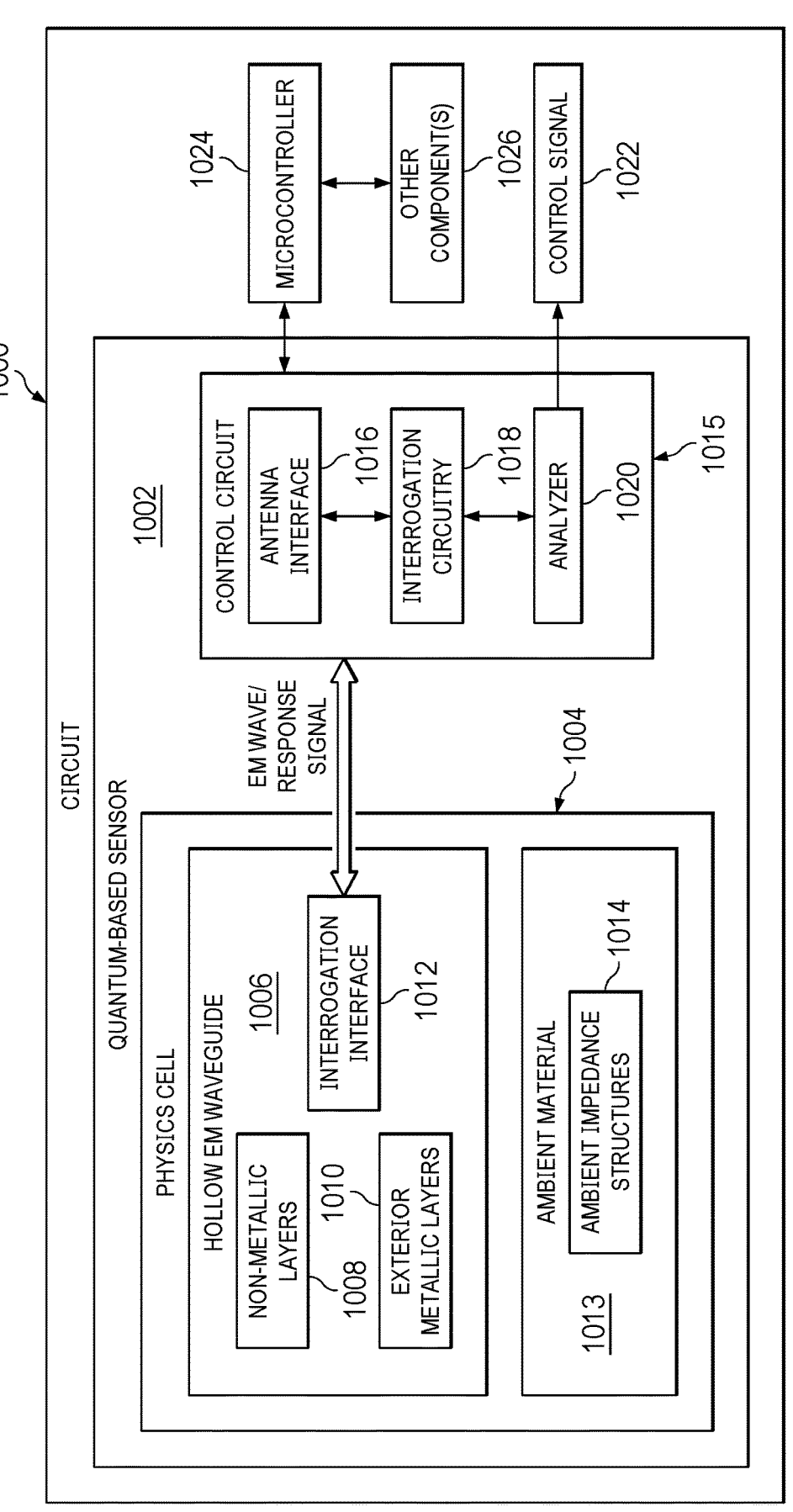
FIG. 10 is a block diagram showing a circuit having a quantum-based sensor in accordance with an example embodiment.

FIG. 10 is a block diagram showing a circuit 1000 having a quantum-based sensor 1002 in accordance with an example embodiment. In the example of FIG. 10, the quantum-based sensor 1002 includes a physics cell 1004 (e.g., the physics cell 300 on FIGS. 3A-3C, or the physics cell 700 of FIG. 7). The physics cell 1004 includes a hollow EM waveguide 1006 (e.g., the hollow EM waveguide 340 of FIGS. 3B, 3C, and 6A-6C, or the hollow EM waveguide 702 of FIGS. 7 and 9A-9C). In some example embodiments, the hollow EM waveguide 1006 provides a propagation path such as: a U shape (see e.g., FIG. 2); a W shape; an S shape; a spiral shape, and/or other shapes. The hollow EM waveguide 1006 includes, for example, non-metallic layers 1008 (e.g., the first non-metallic layer 308, the second non-metallic layer 314, and the third non-metallic layer 322 of FIGS. 3A-3C), exterior metallic layers 1010 (e.g., the first metallic layer 302 and the second metallic layer 328 of FIGS. 3A-3C), and an interrogation interface 1012. The interrogation interface 1012 may include one or more windows in the hollow EM waveguide 1006. During operations of the quantum-based sensor 1002, one or more EM waves are introduced into the hollow EM waveguide 1006 of the physics cell 1004 via the interrogation interface 1012. Also, one or more response signals, based on the introduced EM wave, are obtained from the hollow EM waveguide 1006 via the interrogation interface 1012. To help reduce energy loss during operations of the quantum-based sensor 1002, the physics cell 1004 may include ambient impedance structures 1014 (e.g., the EBG structures 704 of FIG. 7). The ambient impedance structures 1014 are distributed, for example, on the surface of ambient material 1013 (e.g., the exterior surfaces of non-metallic layers used to form the hollow EM waveguide 702 of FIGS. 7 and 9A-9C) surrounding the hollow EM waveguide 1006 to enhance EM field propagation and/or reduce related losses.

In some example embodiments, the quantum-based sensor 1002 includes a control circuit 1015 having an antenna interface 1016, interrogation circuitry 1018, and an analyzer circuit 1020. In operation, the control circuit 1015 is configured to: emit an EM wave to the interrogation interface 1012 via the antenna interface 1016; receive a response signal via the interrogation interface 1012 and the antenna interface 1016; analyze the response signal using the analyzer circuit 1020; and provide a parameter, parameter value, or related control signal 1022 based on the analysis. In the example of FIG. 10, the control signal 1022 is provided to a microcontroller 1024 coupled to the quantum-based sensor 1002. The microcontroller 1024 may use the control signal 1022 to perform its own operations and/or to direct other component(s) 1026 coupled to the microcontroller 1024. The timing of the quantum-based sense operations, the magnitude of the EM wave emitted by the antenna interface 1016 to the interrogation interface 1012, the EM transmission mode, and/or other features of the quantum-based sense operations may be directed by the interrogation circuitry 1018. In different example embodiments, the quantum-based sensor 1002 is used to determine a clock signal, presence or magnitude of an ambient electric field, presence or magnitude of an ambient magnetic field, and/or other operations. The parameter(s) detected by the quantum-based sensor 1002 or resulting signals may be used by the microcontroller 1024 and/or the other component(s) 1026 of the circuit 1000.

In some example embodiments, the quantum-based sensor 1002 includes a hollow EM waveguide 1006 having a first metallic layer (e.g., the first metallic layer 302 of FIGS. 3A-3C) having a first surface (e.g., the first surface 304 of FIG. 3A) and a second surface (e.g., the second surface 306 of FIG. 3A) opposite the first surface. The hollow EM waveguide 1006 may further include a first non-metallic layer (e.g., the first non-metallic layer 308 of FIGS. 3A-3C) adjacent the first metallic layer, the first non-metallic layer having a first surface (e.g., the first surface 310 of FIG. 3A) and a second surface (e.g., the second surface 312 of FIG. 3A) opposite the first surface, the first surface of the first non-metallic layer facing the second surface of the first metallic layer. The hollow EM waveguide 1006 may further include a second non-metallic layer (e.g., the second non-metallic layer 314 of FIGS. 3A-3C) adjacent the second surface of the first non-metallic layer, the second non-metallic layer having a first surface (e.g., the first surface 316 of FIG. 3A), a second surface (e.g., the second surface 318 of FIG. 3A) opposite the first surface, a third surface (e.g., the third surface 315 of FIG. 3A) and a fourth surface (e.g., the fourth surface 317 of FIG. 3A), the first surface of the second non-metallic layer facing the second surface of the first non-metallic layer, the third surface of the second non-metallic layer forming a first side wall of the hollow EM waveguide 1006, and the fourth surface of the second non-metallic layer forming a second side wall of the hollow EM waveguide 1006 opposite the first side wall. The hollow EM waveguide 1006 may further include a third non-metallic layer (e.g., the third non-metallic layer 322 of FIGS. 3A-3C) adjacent the second surface of the second non-metallic layer, the third non-metallic layer having a first surface (e.g., the first surface 324 of FIG. 3A) and a second surface (e.g., the second surface 326 of FIG. 3A) opposite the first surface, the first surface of the third non-metallic layer facing the second surface of the second non-metallic layer. The hollow EM waveguide 1006 may further include a second metallic layer (e.g., the second metallic layer 328 of FIGS. 3A-3C) adjacent the third non-metallic layer and having a first surface (e.g., the first surface 330 of FIG. 3A) and a second surface (e.g., the second surface 332 of FIG. 3A) opposite the first surface, the second surface of the third non-metallic layer facing the first surface of the second metallic layer. In the example of FIG. 10, the hollow EM waveguide 1006 encloses a gas having a pressure that is less than a threshold pressure and all interior surfaces of the hollow EM waveguide 1006 in contact with the gas are non-metallic.

In some example embodiments, the first non-metallic layer is glass, the second non-metallic layer is a semiconductor material, and the third non-metallic layer is glass. In some example embodiments, the second surface of the first non-metallic layer is bonded to the first surface of the second non-metallic layer, and the second surface of the second non-metallic layer is bonded to the first surface of the third non-metallic layer. In some example embodiments, the second non-metallic layer is a semiconductor wafer having a uniform doping based on a target resistivity for the third and fourth surfaces of the second non-metallic layer. In some example embodiments, the second non-metallic layer is a semiconductor material having a variable doping based on a target surface resistivity for the third and fourth surfaces of the second non-metallic layer. In some example embodiments, a thickness of each of the first and third non-metallic layers is between three to five times the skin depth as calculated using the resistivity of the doped semiconductor layer and the frequency of operation of the quantum-based sensor. In some example embodiments, a thickness of each of the first and second metallic layers is between three to five times the skin depth as calculated using the resistivity of the metal used (e.g., for Cu this is approximate 2 um) and the frequency of operation of the quantum-based sensor. A roughness of each of the first and second metallic layers may be between 0.1 um to 0.2 um.

In some example embodiments, the hollow EM waveguide 1006 is part of a physics cell (e.g., the physics cell 1004) that includes ambient material (e.g., the ambient material 1013 of FIG. 10) around the hollow EM waveguide 1006. The ambient material may include, for example, ambient portions of the first non-metallic layer 308, the second non-metallic layer 314 and the third non-metallic layer 322. In such embodiments, at least some of the ambient portion of the first surface of the first non-metallic layer may be covered by first EBG structures (e.g., the EBG structures 702 on the first surface 310 of the first non-metallic layer 308), and at least some of the ambient portion of the second surface of the third non-metallic layer covered by second EBG structures (e.g., the EBG structures 702 on the second surface 326 of the third non-metallic layer 322).

In some example embodiments, the first electronic band gap structures include spaced high-resistivity structures that extend from a position of the hollow EM waveguide 1006 in the physics cell 1004 to ambient portions of the first surface of the first non-metallic layer for at least two wavelengths of energy related to a target interrogation signal (e.g., determined by the interrogation circuitry 1018) for the hollow EM waveguide 1006. Also, the second electronic band gap structures may include spaced high-resistivity structures that extend from a position of the hollow EM waveguide in the physics cell to ambient portions of the second surface of the third non-metallic layer for at least two wavelengths of energy related to a target interrogation signal for the hollow EM waveguide.

In some example embodiments, the quantum-based sensor 1002 includes: a first window (e.g., part of the interrogation interface 1012) aligned with the hollow EM waveguide 1006; a first antenna (e.g., part of the antenna interface 1016) aligned with the first window; a second window (e.g., part of the interrogation interface 1012) aligned with the hollow EM waveguide 1006 and spaced from the first window; a second antenna (e.g., part of the antenna interface 1016) aligned with the second window; and a control circuit (e.g., the control circuit 1015) coupled to the first antenna and the second antenna. The control circuit 1015 is configured to: provide an interrogation signal (e.g., the signal used to generate the EM wave of FIG. 10) to the first antenna; receive an interrogation response signal (e.g., the response signal of FIG. 10) from the second antenna; analyze a frequency response of the interrogation response signal; detect a quantum effect of the gas in response to the interrogation signal based on the frequency response; and generate a signal (e.g., the control signal 1022 of FIG. 10) based on the detected quantum effect.

In some example embodiments, a circuit (e.g., the circuit 1000) includes: a hollow EM waveguide (e.g., the hollow EM waveguide 1006 of FIG. 10) configured to enclose a gas having a pressure that is less than a threshold pressure, wherein all interior surfaces of the hollow EM waveguide in contact with the gas are non-metallic; and a control circuit (e.g., the control circuit 1015 of FIG. 10) having an antenna interface aligned with the hollow EM waveguide. The control circuit is configured to: apply an interrogation signal to an interrogation interface of the hollow EM waveguide 1006; receive an interrogation response signal from the interrogation interface; analyze a frequency response of the interrogation response signal; detect a quantum effect of the gas in response to the interrogation signal based on the frequency response; and generate a signal based on the detected quantum effect.

Figure 11:
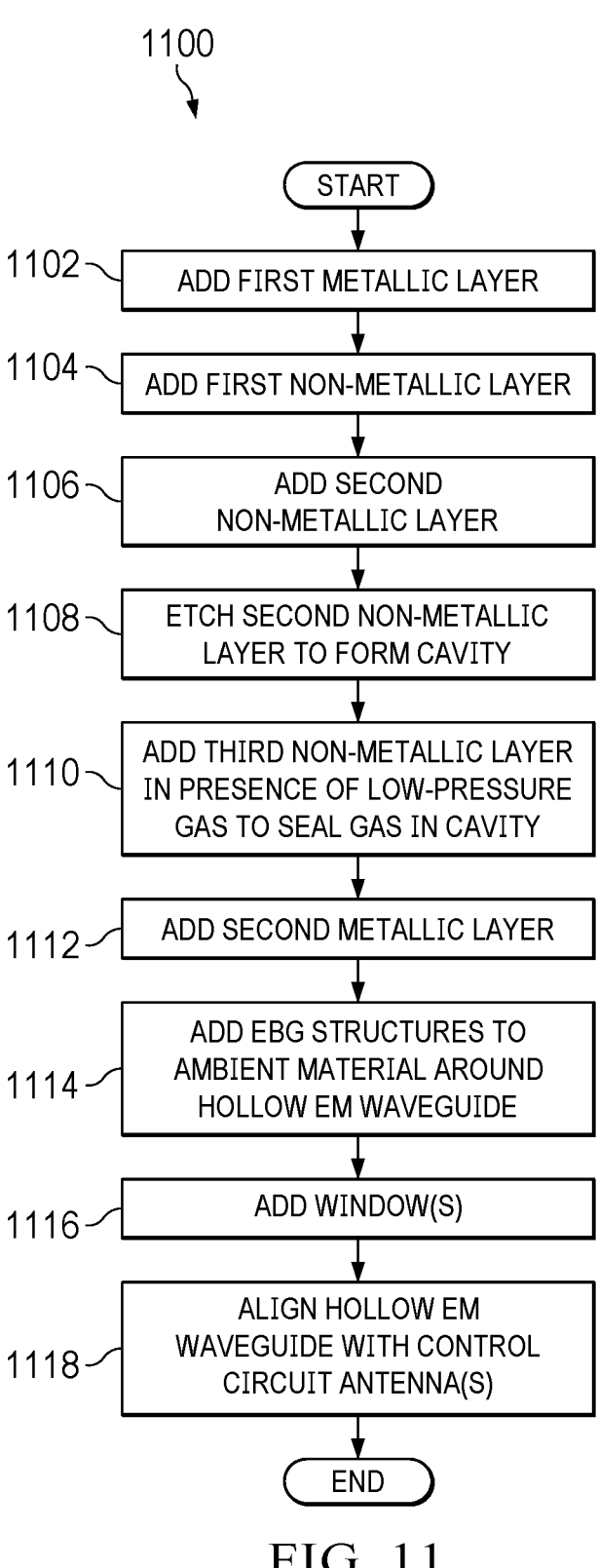
FIG. 11 is a flowchart showing a method of manufacturing a quantum-based sensor in accordance with an example embodiment.

FIG. 11 is a flowchart showing a method 1100 of manufacturing a quantum-based sensor (e.g., the quantum-based sensor 1002 of FIG. 10) in accordance with an example embodiment. The method 1100 may be performed, for example, by standard tools used in the semiconductor industry to process Silicon wafers. Some of these tools are dry or wet etching tools to etch the cavities, evaporation or sputtering tools to deposit metal over semiconductor wafers, photolithography tools to pattern these metallic layers and anodic and eutectic bond tools to bond different wafers to form only one body. In different example embodiments, the order in which layers of a quantum-based sensor or related physics cell are added may vary. As shown, the method 1100 includes adding a first metallic layer (e.g., the first metallic layer 302 of FIGS. 3A-3C) at block 1102. At block 1104, a first non-metallic layer (e.g., the first non-metallic layer 308 of FIG. 3A-3C) is added. At block 1106, a second non-metallic layer (e.g., the second non-metallic layer 314 of FIGS. 3A-3C) is added. At block 1108, the second non-metallic layer is etched to form a cavity (e.g., the cavity 320 in FIGS. 3B and 3C). At block 1110, a third non-metallic layer is added in presence of low-pressure gas such that the low-pressure gas is sealed in the cavity. At block 1112, a second metallic layer (e.g., the second metallic layer 328 in FIGS. 3A-3C) is added. At block 1114, EBG structures are added to ambient material (e.g., exterior surfaces of the first non-metallic layer and the third non-metallic layer) around a hollow EM waveguide (e.g., the hollow EM waveguide 340 in FIGS. 3B, 3C and 6A-6C, or the hollow EM waveguide 702 in FIGS. 7 and 9A-9C). The hollow EM waveguide is formed based on the first non-metallic layer, the second non-metallic layer, and the third non-metallic layer. At block 1116, one or more windows are added to the hollow EM waveguide to enable an EM wave to enter and exit the hollow EM waveguide. At block 1118, the hollow EM waveguide is aligned with one or more antennas of a control circuit (e.g., the control circuit 1015 of FIG. 10). During operations of the quantum-based sensor, an EM wave emitted by an antenna enters the hollow EM waveguide via an interrogation interface (e.g., a window). The EM wave propagates along the hollow EM waveguide and interacts with the sealed gas. Eventually, the EM wave or related energy exits the hollow EM waveguide via an interrogation interface (e.g., a window), where the response signal is affected by the sealed gas. The frequency content of the response signal is analyzed and used to determine a quantum-based parameter.

In some example embodiments, a method of manufacturing a quantum-based sensor includes: adding a first set of layers (e.g., the first non-metallic layer 308 and the second non-metallic layer 314 of FIGS. 3A-3C) of a physics cell to form part of a hollow EM waveguide; adding a second set of layers (e.g., the third non-metallic layer 322 of FIGS. 3A-3C) of the physics cell to enclose a gas having a pressure that is less than a threshold pressure and complete the hollow EM waveguide, wherein all interior surfaces of the hollow EM waveguide in contact with the gas are non-metallic; aligning an interrogation interface of the hollow EM waveguide with an antenna interface of a control circuit separate from the physics cell; and bonding the physics cell to the control circuit.

In some example embodiment, adding the first set of layers includes: adding a first metallic layer having a first surface and a second surface opposite the first surface; adding a first non-metallic layer adjacent the first metallic layer, the first non-metallic layer having a first surface and a second surface opposite the first surface, the first surface of the first non-metallic layer facing the second surface of the first metallic layer; and adding a second non-metallic layer adjacent the second surface of the first non-metallic layer. In some example embodiments, the second non-metallic layer has a first surface, a second surface opposite the first surface, a third surface and a fourth surface, the first surface of the second non-metallic layer facing the second surface of the first non-metallic layer, the third surface of the second non-metallic layer forming a first side wall of the hollow EM waveguide, and the fourth surface of the second non-metallic layer forming a second side wall of the hollow EM waveguide opposite the first side wall.

In some example embodiments, adding the second set of layer includes: adding a third non-metallic layer adjacent the second surface of the second non-metallic layer, the third non-metallic layer having a first surface and a second surface opposite the first surface, the first surface of the third non-metallic layer facing the second surface of the second non-metallic layer; and adding a second metallic layer adjacent the third non-metallic layer and having a first surface and a second surface opposite the first surface, the second surface of the third non-metallic layer facing the first surface of the second metallic layer.

In some example embodiments, adding the first set of layers includes bonding the second surface of the first non-metallic layer to the first surface of the second non-metallic layer, and adding the second set of layers includes bonding the second surface of the second non-metallic layer to the first surface of the third non-metallic layer in presence of the gas. In some example embodiments, the physics cell includes ambient material around the hollow EM waveguide, the ambient material including ambient portions of the first non-metallic layer, the second non-metallic layer and the third non-metallic layer. In such embodiments, the method may include: covering at least some of the ambient portion of the first surface of the first non-metallic layer with first electronic band gap structures; and covering at least some of the ambient portion of the second surface of the third non-metallic layer with second electronic band gap structures.

In some example embodiments, the method 1100 includes selecting parameters of a physics cell to achieve a target performance for the quantum-based sensor. Example parameters include a thickness of the first non-metallic layer, a thickness of the third non-metallic layer, a resistivity of the third surface of the second non-metallic layer, a resistivity of the fourth surface of the second non-metallic layer, a spacing between structures of the first electronic band gap structures, and a spacing between structures of the second electronic band gap structures.

FIG. 12 is a flowchart showing a quantum-based sensor method 1200 in accordance with an example embodiment. The method 1200 is performed, for example, by a control circuit (e.g., the control circuit 1015 of FIG. 10) for a quantum-based sensor (e.g., the quantum-based sensor 1002 of FIG. 10). As shown, the method 1200 includes receiving a quantum-based sensor interrogation request at block 1202. The quantum-based sensor interrogation request may be based on a schedule, a timer, commands from a microcontroller (e.g., the microcontroller 1024 of FIG. 10), and/or other trigger options. At block 1204, an interrogation signal is introduced to a hollow EM waveguide that encloses a gas a low pressure, where all interior surfaces of the hollow EM waveguide in contact with the gas are non-metallic. At block 1206, an interrogation response signal 1206 is received (e.g., by the antenna interface 1016 of FIG. 10). At block 1208, the frequency response of the interrogation response signal is analyzed (e.g., by the analyzer circuit 1020 of the control circuit 1015 of FIG. 10). At block 1210, a quantum effect of the gas in response to the interrogation signal is detected (e.g., by the analyzer circuit 1020 of the control circuit 1015 of FIG. 10). At block 1212, a signal is generated (e.g., by the analyzer circuit 1020 of the control circuit 1015 of FIG. 10) based on the detected quantum effect. The signal generated at block 1212 may be, for example, a clock signal, an electric field detection signal, an electric field magnitude signal, a magnetic field detection signal, a magnetic field magnitude signal, a control signal, and/or other signal.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An apparatus, comprising:
   an electromagnetic (EM) waveguide including a container having a cavity configurable to hold a gas and prevent the gas from being in contact with a metal; and
   first and second metallic layers exterior to and on opposing first and second sides of the cavity.

2. The apparatus of claim 1, wherein the container includes a first layer and a second layer of a semiconductor material between two layers of a glass material, and the gas is in a space between the first and second layers of the semiconductor material and between the two layers of the glass material.

3. The apparatus of claim 2, wherein the first and second layers of the semiconductor material are bonded to the two layers of the glass material.

4. The apparatus of claim 2, wherein each of the first and second layers of the semiconductor material is uniform doped.

5. The apparatus of claim 1, wherein the EM waveguide is part of a quantum-based sensor, and a thickness of the container is based on a skin depth, and the skin depth is based on a resistivity of at least a portion of the container and a frequency of operation of the quantum-based sensor.

6. The apparatus of claim 1, further comprising electronic band gap structures on at least opposing third and fourth sides of the cavity, the third and fourth sides angled from the first and second sides.

7. The apparatus of claim 6, wherein the electronic band gap structures having a frequency band of operation that overlaps at least partly with a frequency band of operation of the quantum-based sensor.

8. The apparatus of claim 1, wherein the container is configured as an electromagnetic (EM) waveguide and includes a first electromagnetic (EM) opening and a second EM opening, and the apparatus further comprises:
   a first window aligned with the first EM opening;
   a first antenna aligned with the first window;
   a second window aligned with the second EM opening and spaced from the first window;
   a second antenna aligned with the second window; and
   control circuit coupled to the first antenna and the second antenna, and configurable to:
      provide an interrogation signal to the first antenna;
      receive an interrogation response signal from the second antenna;
      determine a frequency response of the interrogation response signal;
      determine a quantum transition of the gas in response to the interrogation signal based on the frequency response; and
      generate a signal based on the quantum transition.

9. A circuit, comprising:
   a container holding a gas, in which the gas is not in contact with a metal;
   a control circuit having an antenna, the antenna configurable to interface with the container, and the control circuit is configurable to:
      provide a first signal to the gas in the container via the antenna;
      receive a second signal from the gas in the container in response to the first signal via the antenna; and
      generate a third signal based on the second signal.

10. The circuit of claim 9, wherein the container includes a first layer and a second layer of a semiconductor material between two layers of a glass material, and the gas is in a space between the first and second layers of the semiconductor material and between the two layers of the glass material.

11. The circuit of claim 10, wherein the first and second layers of the semiconductor material are bonded to the two layers of the glass material.

12. The circuit of claim 10, wherein a thickness of the container is based on a skin depth, and the skin depth is based on a frequency of operation of the container.

13. The circuit of claim 10, further comprising electronic band gap structures on a least two opposing sides of the container.

14. A method, comprising:
   combining a first set of layers and a second set of layers in presence of a gas to form an EM waveguide holding the gas, wherein the gas in the container is not in contact with a metal, in which the first set of layers includes a first metallic layer, the second set of layers includes a second metallic layer, and the first metallic layer opposes the second metallic layer; and aligning an electromagnetic (EM) opening of the EM waveguide with an antenna of a control circuit.

15. The method of claim 14, wherein the first set of layers and the second set of layers form a container that is part of the EM waveguide, and the method further comprises forming the first set of layers including:

forming the first metallic layer having a first surface and a second surface opposite the first surface;

forming a first non-metallic layer adjacent the first metallic layer, the first non-metallic layer having a first surface and a second surface opposite the first surface, the first surface of the first non-metallic layer facing the second surface of the first metallic layer; and forming a second non-metallic layer adjacent the second surface of the first non-metallic layer, the second non-metallic layer having a first surface, a second surface opposite the first surface, a third surface and a fourth surface, the first surface of the second non-metallic layer facing the second surface of the first non-metallic layer, the third surface of the second non-metallic layer forming a first side wall of the container, and the fourth surface of the second non-metallic layer forming a second side wall of the container opposing the first side wall.

16. The method of claim 15, further comprising forming the second set of layer including:

forming a third non-metallic layer adjacent the second surface of the second non-metallic layer, the third non-metallic layer having a first surface and a second surface opposite the first surface, the first surface of the third non-metallic layer facing the second surface of the second non-metallic layer; and forming the second metallic layer adjacent the third non-metallic layer and having a first surface and a second surface opposite the first surface, the second surface of the third non-metallic layer facing the first surface of the second metallic layer.

17. The method of claim 16, wherein the method further comprising:

covering at least a portion of the first surface of the first non-metallic layer with first electronic band gap structures; and covering at least a portion of the second surface of the third non-metallic layer with second electronic band gap structures.

18. The method of claim 17, further comprising:

selecting parameters based on a target performance for a quantum-based sensor including the container, the selected parameters including a thickness of the first non-metallic layer, a thickness of the third non-metallic layer, a resistivity of the third surface of the second non-metallic layer, a resistivity of the fourth surface of the second non-metallic layer, a spacing between structures of the first electronic band gap structures, and a spacing between structures of the second electronic band gap structures.

19. The circuit of claim 9, wherein the container is configured as an EM waveguide.

20. The circuit of claim 9, wherein the control circuit is configurable to:

determine a frequency response of the second signal;

determine a quantum transition of the gas in response to the first signal based on the frequency response; and generate the third signal based on the quantum transition.

21. An apparatus, comprising:

an EM waveguide including a container configurable to hold a gas, in which an entirety of internal surfaces of the container is non-metallic.

22. The apparatus of claim 21, wherein the EM waveguide includes first and second metallic electromagnetic (EM) reflector layers exterior to and on opposing first and second sides of the container.

* * * * *